US006738281B2

(12) United States Patent
Yokozeki

(10) Patent No.: US 6,738,281 B2
(45) Date of Patent: May 18, 2004

(54) SEMICONDUCTOR INTEGRATED CIRCUIT AND SEMICONDUCTOR MEMORY

(75) Inventor: Wataru Yokozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 22 days.

(21) Appl. No.: 10/269,858

(22) Filed: Oct. 15, 2002

(65) Prior Publication Data

US 2003/0123276 A1 Jul. 3, 2003

(30) Foreign Application Priority Data

Dec. 28, 2001 (JP) ....................................... 2001-400507

(51) Int. Cl.[7] ................................................ G11C 11/22
(52) U.S. Cl. .................. 365/145; 365/154; 365/185.08
(58) Field of Search ................................ 365/145, 154, 365/185.07, 185.08

(56) References Cited

U.S. PATENT DOCUMENTS

| | | | | |
|---|---|---|---|---|
| 5,592,411 A | | 1/1997 | Tai | |
| 5,936,879 A | * | 8/1999 | Brouwer et al. | 365/145 |
| 6,646,909 B2 | * | 11/2003 | Miwa et al. | 365/154 |

FOREIGN PATENT DOCUMENTS

| | | |
|---|---|---|
| JP | 9-147578 | 6/1997 |
| JP | 2000-048576 | 2/2000 |
| JP | 2000-077982 | 3/2000 |

OTHER PUBLICATIONS

"NV–SRAM: a Nonvolatile SRAM with Back–up Ferroelectric Capactiors", Miwa et al, *IEEE 2000 Custom Integrated Circuits Conference*, May 2000, pp. 65–68.

* cited by examiner

*Primary Examiner*—Tan T. Nguyen
(74) *Attorney, Agent, or Firm*—Arent Fox, PLLC

(57) ABSTRACT

Inputs of two buffer circuits which constitute a latch circuit receive different voltages due to a capacitance coupling effect of ferroelectric capacitors or capacitance division of the ferroelectric capacitors, before connected with power source. After the power turns on, a switch control circuit activates switch control signals when a first plate voltage rises to a predetermined voltage. Switch circuits turn on in response to the activation of the switch control signals, and connect power source terminals of the buffer circuits to a power source line. At this time, input voltages of the buffer circuits are different from each other, and therefore, logic data is written into the latch circuit according to each of the input voltages. As a result of this, data held in the latch circuit before turning-off of the power can be reproduced without fail.

17 Claims, 17 Drawing Sheets

SEMICONDUCTOR INTEGRATED CIRCUIT AND SEMICONDUCTOR MEMORY

BACKGROUND OF THE INVENTION

1. Field of the Invention

The present invention relates to a semiconductor integrated circuit and a semiconductor memory having a latch circuit using a ferroelectric capacitor.

2. Description of the Related Art

In general, a latch circuit formed in a semiconductor integrated circuit is volatile, and therefore, data which is held therein is lost after turning-off of the power. Recently, a latch circuit is formed by using a ferroelectric film as a variable capacitor, and a nonvolatile SRAM (Static Random Access Memory) which adopts this latch circuit as a memory cell has been proposed (T. Miwa et al. in Proc. of CICC, May 2000, pp65–68).

FIG. 1 shows a memory cell of a semiconductor memory of this kind.

The memory cell includes a latch circuit 2 which is composed of two CMOS inverters 1*a* and 1*b* whose inputs and outputs are connected to each other, ferroelectric capacitors 3*a* and 3*b* which are respectively connected to input nodes N and NX of the CMOS inverters 1*a* and 1*b*, and transfer transistors 4*a* and 4*b* which connect the input nodes N and NX to bit lines BL and BLX, respectively. Gates of the transfer transistors 4*a* and 4*b* are connected to a word line WL.

In this memory cell, data which is written into the latch circuit 2 is held as residual dielectric polarization of the ferroelectric capacitors 3*a* and 3*b* after turning the power off.

When turning the power on, input voltages of the CMOS inverters 1*a* and 1*b* are unbalanced due to a capacitance difference between the nodes N and NX, which corresponds to the residual dielectric polarization. Namely, the data held therein before turning-off of the power is written in the latch circuit 2 again by using the residual dielectric polarization of the ferroelectric capacitors 3*a* and 3*b*. This operation is referred to as recall operation.

Hereinafter, an explanation about turning the power on will be given in detail. First, a plate voltage PL of the ferroelectric capacitors 3*a* and 3*b* is fixed to a ground voltage VSS (0 V), and a power source voltage VDD and the ground voltage VSS are supplied to the CMOS inverters 1*a* and 1*b* which compose the latch circuit 2. Capacitance values of the ferroelectric capacitors 3*a* and 3*b* are different corresponding to polarized states.

The ferroelectric capacitor 3*a* with a large capacitance value takes much time to increase a voltage, as compared with the ferroelectric capacitor 3*b* with a small capacitance value. Hence, a minute voltage difference is generated between the nodes N and NX. This voltage difference is amplified by a differential amplification operation of the latch circuit 2, together with the supply of power source. Then, the nodes N and NX are finally fixed to the power source voltage VDD or the ground voltage VSS. Namely, the data before turning-off of the power is reproduced.

When the power source voltage VDD rises in turning the power on, the nodes N and NX of the latch circuit 2 are respectively charged from a power source line VDD through pMOS transistors of the CMOS inverters 1*a* and 1*b*. Meanwhile, electrical charges of the nodes N and NX are respectively discharged to a ground line VSS through nMOS transistors of the CMOS inverters 1*a* and 1*b*.

When the power source voltage VDD is low, voltages of the nodes N and NX are determined by leak currents of the pMOS transistors and nMOS transistors and capacitances of the nodes N and NX. For example, it is supposed that threshold voltages of the pMOS transistors of the CMOS inverters 1*a* and 1*b* vary by ΔVth=80 mV. At this time, leak currents of the pMOS transistors differ by an order of magnitude (supposing that an S factor=80 mV). Supposing that threshold voltages of the nMOS transistors of the CMOS inverters 1*a* and 1*b* are the same, charging currents of the nodes N and NX become the ones corresponding to the leak currents of the pMOS transistors, respectively.

Real currents for charging the capacitances of the nodes N and NX (including the ferroelectric capacitors 3*a* and 3*b* which are respectively connected to the nodes N and NX) are supposed to be In=1 nA and Inx=0.1 nA, respectively. It should be mentioned that the real currents are differences between the leak currents of the pMOS transistors and the leak currents of the nMOS transistors in the CMOS inverters 1*a* and 1*b*. Further, the capacitances of the nodes N and NX (including the ferroelectric capacitors 3*a* and 3*b*) are supposed to be Cn=200 fF and Cnx=50 fF, respectively.

In this case, voltages Vn and Vnx of the nodes N and NX after 0.5 ms from the turning-on of the power can be expressed by the following expressions (1) and (2).

$$Vn=Qn/Cn=(In\times 0.5E-3)/Cn=0.25[V] \quad (1)$$

$$Vnx=Qnx/Cnx=(Inx\times 0.5E-3)/Cnx=0.1[V] \quad (2)$$

Actually, the difference between the voltages Vn and Vnx increases further because the latch circuit 2 has an amplifying function. In the above example, due to the rise of the power source voltage, the node N finally becomes the power source voltage VDD (logic "H") and the node NX becomes the ground voltage VSS (logic "L").

However, the node N, which originally has a large parasitic capacitance, requires a long charging time, and its logic should be the logic "L". The node NX, which has a small parasitic capacitance, requires a short charging time, and its logic should be the logic "H".

Namely, according to the memory cell shown in FIG. 1, wrong data is reproduced due to variations of the threshold voltages of the pMOS transistors.

Incidentally, wrong recall operation is also caused by variations of the threshold voltages of the nMOS transistors. This kind of malfunction occurs not only in the memory cell, but also in a latch circuit using the residual dielectric polarization of the ferroelectric capacitors.

SUMMARY OF THE INVENTION

It is an object of the present invention to surely perform recall operation of a memory cell and of a latch circuit which use residual dielectric polarization of ferroelectric capacitors.

According to one of the aspects of the present invention, inputs and outputs of two buffer circuits are connected to each other to form a latch circuit. One ends of a pair of ferroelectric capacitors are respectively connected to inputs of the buffer circuits. The other ends of the ferroelectric capacitors are connected to a first plate line. Data held in the latch circuit before turning-off of the power is held as residual dielectric polarization of the ferroelectric capacitors. The latch circuit and the ferroelectric capacitors of the present invention are applied to, for example, at least one of a master latch circuit and a slave latch circuit which are connected in cascade in a storage circuit, or to a memory cell of a semiconductor memory.

A first plate voltage generator generates a first plate voltage to be supplied to the first plate line. After the power turns on, voltages of the other ends of the ferroelectric capacitors rise as the first plate voltage rises. Voltages of the one ends of the ferroelectric capacitors rise according to capacitance values corresponding to polarization of the ferroelectric capacitors, due to a capacitance coupling effect of the ferroelectric capacitors. Namely, before power source is supplied to the two buffer circuits, the input voltages of the buffer circuits become different from each other.

A switch control circuit activates a switch control signal when the first plate voltage rises to a predetermined voltage after the power turns on. A switch circuit turns on in response to the activation of the switch control signal, and connects power supply terminals of the buffer circuits to a power source line. At this time, the input voltages of the buffer circuits are different from each other, and therefore, logic data is written into the latch circuit according to each of the input voltages. As a result of this, data held in the latch circuit before turning-off of the power can be reproduced. Namely, normal recall operation is performed.

According to another aspect of the present invention, a latch circuit is formed of two buffer circuits whose inputs and outputs are connected to each other. A pair of first ferroelectric capacitors are connected in series between a first plate line and a second plate line. An intermediate node which connects the two first ferroelectric capacitors is connected to an input of one of the buffer circuits. A pair of second ferroelectric capacitors are connected in series between the first plate line and the second plate line. An intermediate node which connects the two second ferroelectric capacitors is connected to an input of the other of the buffer circuits. Data held in the latch circuit before turning-off of the power is held as residual dielectric polarization of the ferroelectric capacitors. The latch circuit and the ferroelectric capacitors of the present invention are applied to, for example, at least one of a master latch circuit and a slave latch circuit which are connected in cascade in a storage circuit, or to a memory cell of a semiconductor memory.

A first plate voltage generator generates a first plate voltage to be supplied to the first plate line. A second plate voltage generator generates a second plate voltage which is supplied to the second plate line for a predetermined period after the power turns on. During this period, the second plate voltage is lower than the first plate voltage and is fixed to, for example, a ground voltage. After the power turns on, voltages of the respective intermediate nodes of the first ferroelectric capacitors and of the second ferroelectric capacitors rise according to capacitance division of these ferroelectric capacitors, as the first plate voltage rises. Namely, before power source is supplied to the two buffer circuits, the input voltages of the buffer circuits become different from each other.

A switch control circuit activates a switch control signal when the first plate voltage rises to a predetermined voltage after the power turns on. A switch circuit turns on in response to the activation of the switch control signal, and connects power supply terminals of the buffer circuits to a power source line. At this time, the input voltages of the buffer circuits are different from each other, and therefore, logic data is written into the latch circuit according to each of the input voltages. As a result of this, data held in the latch circuit before turning-off of the power can be reproduced. Namely, normal recall operation is performed.

According to another aspect of the present invention, each of buffer circuits is structured of a CMOS inverter made up of a pMOS transistor and an nMOS transistor. A source of the pMOS transistor is connected to a power source line through a switch circuit, and a substrate of the pMOS transistor is connected to the power source line. A source of the nMOS transistor is connected to a ground line through a switch circuit, and a substrate of the nMOS transistor is connected to the ground line. Therefore, it is possible to prevent floating of the substrates at the time of turning-on of the power, and to prevent a malfunction of the transistors (latchup or the like).

According to another aspect of the present invention, a switch circuit is formed to be common to a plurality of memory cells. This reduces a total number of the switch circuits, thereby reducing a chip size of a semiconductor memory.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be explained with reference to the drawings.

Figure 1:
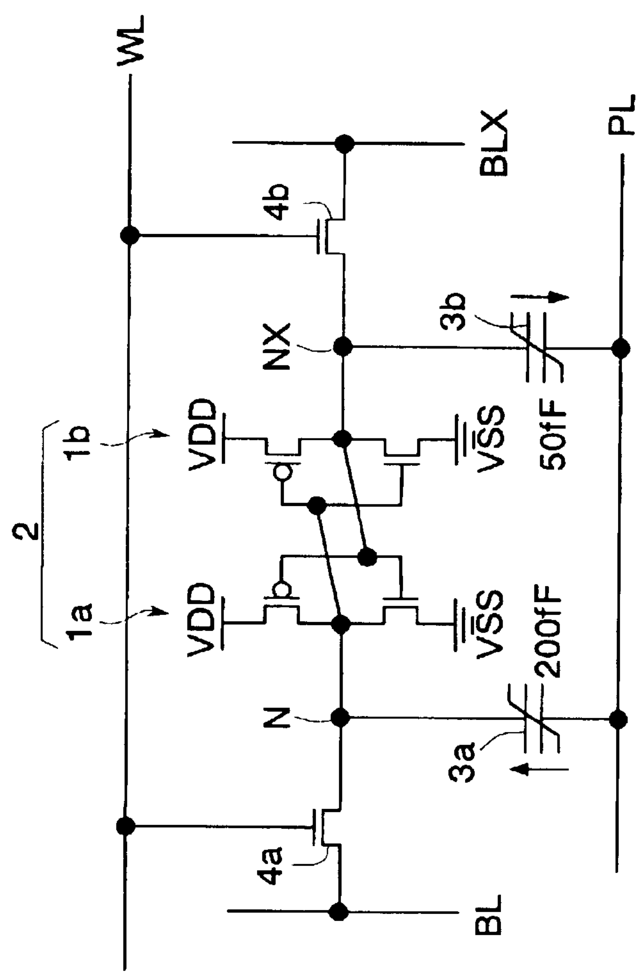
FIG. 1 is a circuit diagram showing a memory cell using conventional ferroelectric capacitors.
Figure 2:
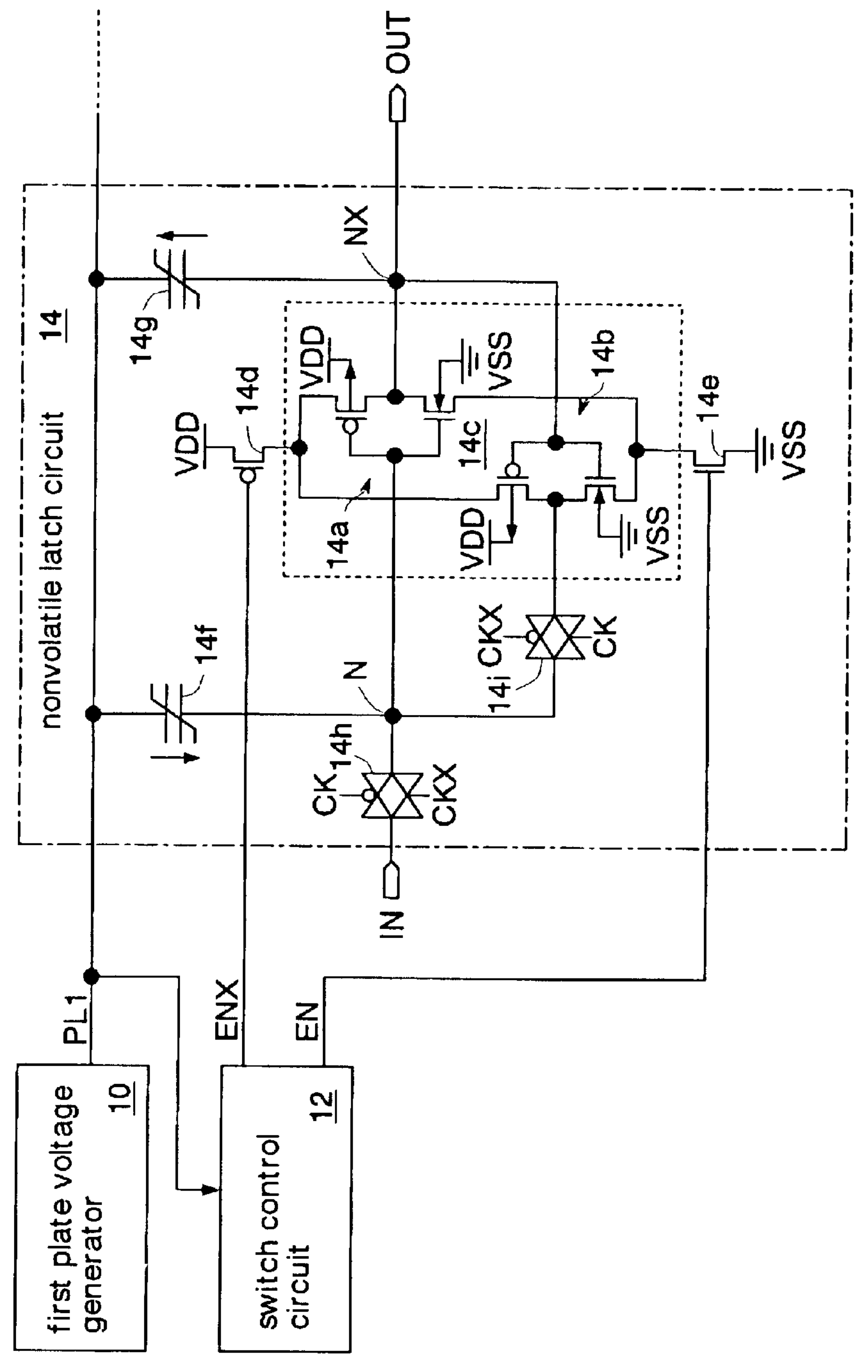
FIG. 2 is a block diagram showing a semiconductor integrated circuit according to a first embodiment of the present invention.

FIG. 2 shows a first embodiment of the present invention. This semiconductor integrated circuit is formed on a silicon substrate by using a CMOS process. The semiconductor integrated circuit includes a first plate voltage generator 10, a switch control circuit 12 and a nonvolatile latch circuit 14. The first plate voltage generator 10 generates a first plate voltage PL1 according to a power supply voltage VDD. The switch control circuit 12 generates switch control signals ENX and EN, which are complementary to each other, according to the first plate voltage PL1. The signal ending with "X" shows negative logic.

The nonvolatile latch circuit 14 includes a latch circuit 14*c* which includes two CMOS inverters (buffer circuits) 14*a* and 14*b* whose inputs and outputs are connected to each other, a switch circuit 14*d* which is made up of a pMOS transistor, a switch circuit 14*e* which is made up of an nMOS transistor, ferroelectric capacitors 14*f* and 14*g*, and CMOS switches 14*h* and 14*i*. Substrates of pMOS transistors and nMOS transistors which make the CMOS inverters 14*a* and 14*b* are connected to the power source line VDD and a ground line VSS, respectively.

The switch circuit 14*d* connects sources (power supply terminals) of the pMOS transistors of the CMOS inverters 14*a* and 14*b* to the power source line VDD. The switch circuit 14*e* connects sources (power supply terminals) of the nMOS transistors of the CMOS inverters 14*a* and 14*b* to the ground line VSS (power source line). One end of the ferroelectric capacitor 14*f* is connected to an input node N of the CMOS inverter 14*a*, and the other end is connected to the plate line PL1. One end of the ferroelectric capacitor 14*g* is connected to an input node NX of the CMOS inverter 14*b*, and the other end is connected to the plate line PL1. Directions of arrows which are added to the ferroelectric capacitors 14*f* and 14*g* indicate polarized states. Electrodes on the sides of tips of the arrows are charged positively.

The CMOS switch 14*h* connects an input IN of the nonvolatile latch circuit 14 to the input node N of the CMOS inverter 14*a*. The CMOS switch 14*h* turns on when a clock signal CK is at a low level (=when a clock signal CKX is at a high level). The CMOS switch 14*i* connects an output of the CMOS inverter 14*b* to an input of the CMOS inverter 14*a*. The CMOS switch 14*i* turns on when the clock signal CK is at the high level (=when the clock signal CKX is at the low level).

Figure 3:
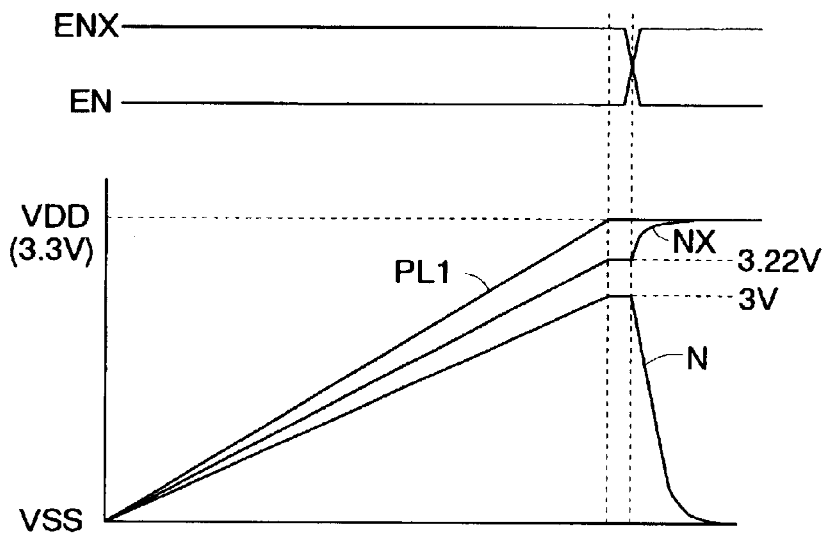
FIG. 3 is a waveform chart showing the operation of the semiconductor integrated circuit according to the first embodiment.

FIG. 3 shows the operation of the semiconductor integrated circuit according to the first embodiment. In this example, the nonvolatile latch circuit 14 which is shown in FIG. 2 holds logic "H" in advance. At this time, the CMOS inverter 14*a* outputs a high level and the CMOS inverter 14*b* outputs a low level. Before turning-off of the power, the first plate voltage PL1 changes to a low level, high level and low level, whereby a low level of the node N and a high level of the node NX are respectively written in as residual dielectric polarization of the ferroelectric capacitors 14*f* and 14*g*. As a result of this, the polarized states (directions of the arrows) of the ferroelectric capacitors 14*f* and 14*g* are made to be opposite to each other, as shown in FIG. 2. In this example, average capacitances of the ferroelectric capacitors 14*f* and 14*g*, which correspond to these polarized states, are made to be 50 fF and 200 fF, respectively, and parasitic capacitances of both of the nodes N and NX are made to be 5 fF.

When the power is on, the clock signals CK and CKX are fixed to the high level and to the low level, respectively. Namely, the CMOS inverters 14*a* and 14*b* of the latch circuit 14*c* form a feedback loop.

The first plate voltage generator 10 follows the power supply voltage VDD to generate the first plate voltage PL1. The first plate voltage PL1 rises to a predetermined power supply voltage VDD (for example, 3.3 V). While the first plate voltage PL1 is rising, the switch control circuit 12 outputs the switch control signal ENX at a high level and the switch control signal EN at a low level. The switch circuits 14*d* and 14*e* are turned off by the switch control signal ENX at the high level and the switch control signal EN at the low level. For this reason, the power supply voltage VDD and the ground voltage VSS are not supplied to the latch circuit 14*c*, and the CMOS inverters 14*a* and 14*b* in the latch circuit 14*c* are inactivated. Therefore, the nodes N and NX are floated.

The power supply voltage VDD and the ground voltage VSS are directly supplied to the substrates of the PMOS transistors and the nMOS transistors of the CMOS inverters 14*a* and 14*b*, respectively. For this reason, it is possible to avoid occurrence of latchup while the switch circuits 14*d* and 14*e* are off.

Due to a capacitance coupling effect of the ferroelectric capacitors 14*f* and 14*g*, voltages of the nodes N and NX rise as the first plate voltage PL1 rises. When the first plate voltage PL1 rises to the power supply voltage VDD (3.3 V), the voltage of the node N becomes 3 V (3.3 V×50 fF/(5 fF+50 fF)), and the voltage of the node NX becomes 3.22 V (3.3 V×200 fF/(5 fF+200 fF)).

After the first plate voltage PL1 rose to the power supply voltage VDD, the switch control circuit 12 changes the switch control signals EN and ENX to the high level and to the low level, respectively. Because of these changes, the power supply voltage VDD and the ground voltage VSS are supplied to the CMOS inverters 14*a* and 14*b* of the latch circuit 14*c*, and the CMOS inverters 14*a* and 14*b* are activated. The input nodes N and NX of the CMOS inverters 14*a* and 14*b* have a voltage difference (offset voltage) of 220 mV, as described above. The latch circuit 14*c* amplifies this voltage difference. Finally, the voltage of the node N becomes the ground voltage VSS (logic "L"), and the voltage of the node NX becomes the power supply voltage VDD (logic "H"). As a result of this, data corresponding to the residual dielectric polarization of the ferroelectric capacitors 14*f* and 14*g* is read into the latch circuit 14*c*. Namely, the data which is held in the latch circuit 14*c* before turning-off of the power is reproduced by recall operation.

Figure 4:
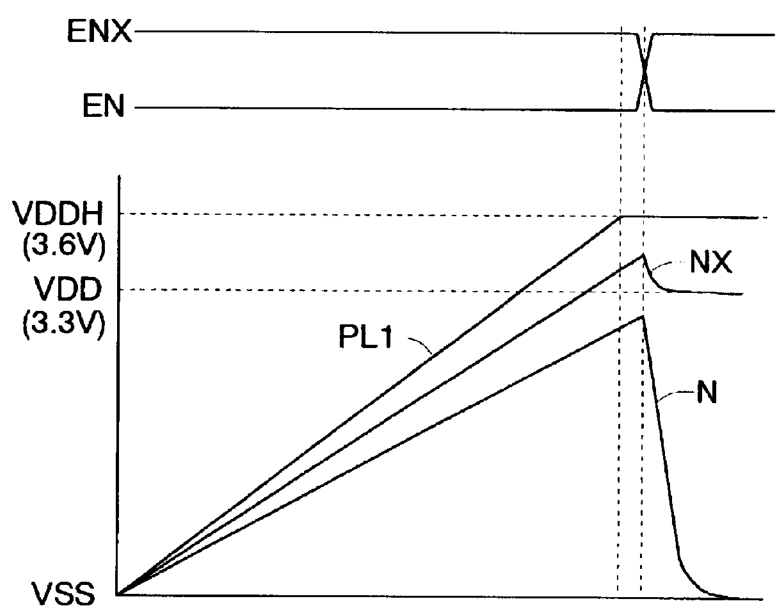
FIG. 4 is another waveform chart showing the operation of the semiconductor integrated circuit according to the first embodiment.

FIG. 4 shows another operation of the semiconductor integrated circuit according to the first embodiment. In this example, the first plate voltage generator 10 generates a first plate voltage PL1 (VDDH=3.6 V) which is higher than the power supply voltage VDD (3.3 V). Hence, the offset voltage of the input nodes N and NX before the activation of the CMOS inverters 14*a* and 14*b* is larger than that shown in FIG. 3. When the first plate voltage PL1 is set to be 10% higher, the offset voltage increases 10% as well. Therefore, it is possible to perform the recall operation more securely.

It should be noted that, when a plurality of the nonvolatile latch circuits 14 are formed in the semiconductor integrated circuit, a chip size of the semiconductor integrated circuit can be reduced by forming the switch circuits 14*d* and 14*e* which are common to these nonvolatile latch circuits 14.

According to the above-described embodiment, the voltages which are different from each other are supplied to the inputs of the two CMOS inverters 14*a* and 14*b* which compose the latch circuit 14*c*, by using the capacitance coupling effect of the ferroelectric capacitors 14*f* and 14*g*, and thereafter, the power supply voltage VDD and the ground voltage VSS are supplied to the CMOS inverters 14*a* and 14*b*. Hence, the data which is held in the latch circuit 14*c* before turning-off of the power can be reproduced without fail. Namely, it is possible to perform the recall operation with reliability.

The substrates of the pMOS transistors and the nMOS transistors of the CMOS inverters 14*a* and 14*b* are respectively connected to the power supply line VDD and the ground line VSS. For this reason, it is possible to avoid the floating of the substrates in turning the power on, and to avoid a malfunction of the transistors (latchup or the like).

Figure 5:
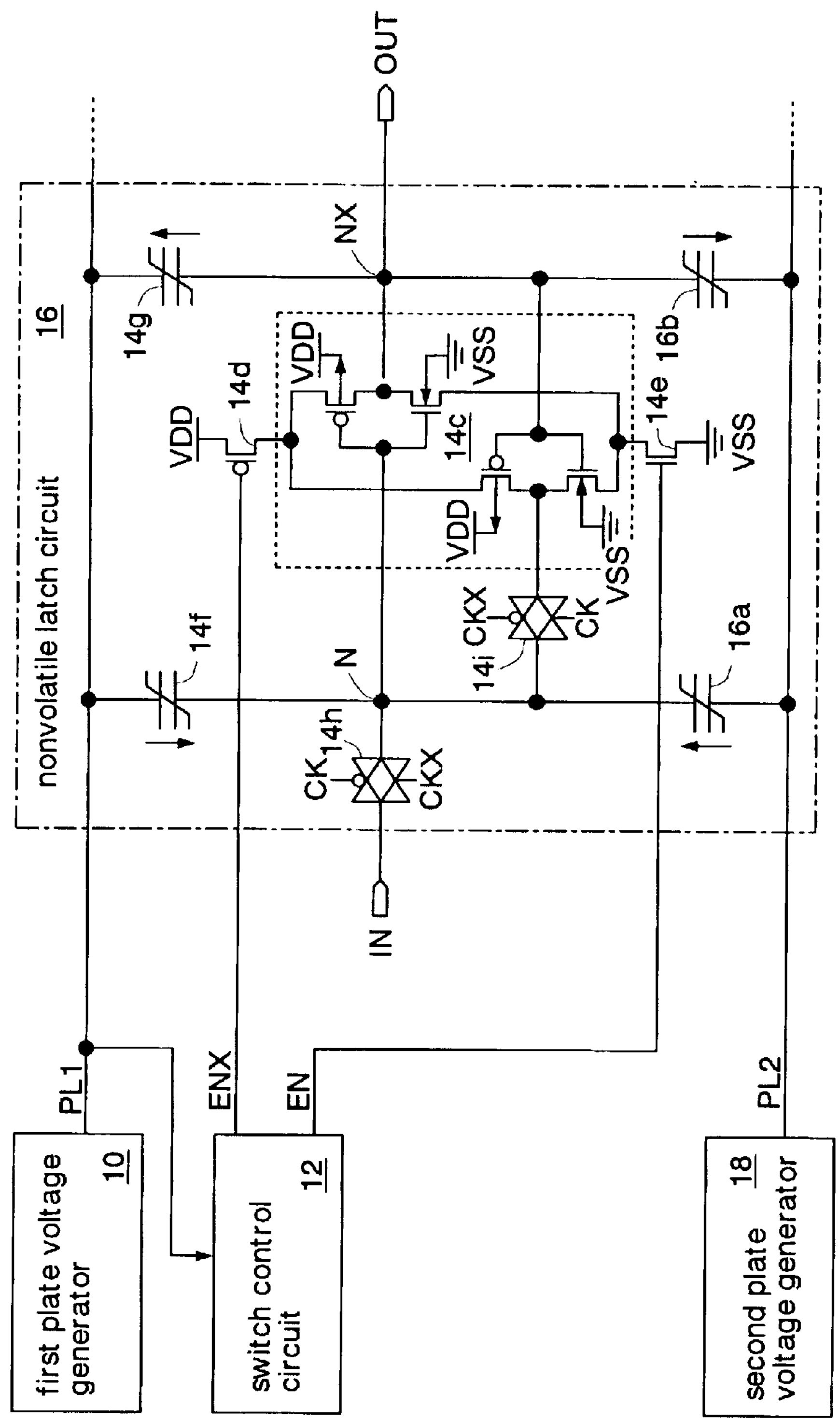
FIG. 5 is a block diagram showing a semiconductor integrated circuit according to a second embodiment of the present invention.

FIG. 5 shows a second embodiment of the present invention. The same numerals and symbols are given to designate the same circuits and signals as those explained in the first embodiment, and detailed explanations thereof will be omitted.

According to this embodiment, ferroelectric capacitors 16*a* and 16*b* are added to the nonvolatile latch circuit 14 of the first embodiment, thereby forming a nonvolatile latch circuit 16. Moreover, a second plate voltage generator 18 for generating a second plate voltage PL2 is formed. The rest of the structure is the same as that of the first embodiment. Namely, the nonvolatile latch circuit 16 includes a latch circuit 14*c* which includes CMOS inverters 14*a* and 14*b*, switch circuits 14*d* and 14*e*, ferroelectric capacitors 14*f* and 14*g*, and CMOS switches 14*h* and 14*i*. Substrates of pMOS transistors and nMOS transistors which make the CMOS inverters 14*a* and 14*b* are connected to a power source line VDD and a ground line VSS, respectively.

One end of the ferroelectric capacitor 16*a* is connected to an input node N of the CMOS inverter 14*a*, and the other end is connected to the second plate line PL2. One end of the ferroelectric capacitor 16*b* is connected to an input node NX of the CMOS inverter 14*b*, and the other end is connected to the second plate line PL2.

Figure 6:
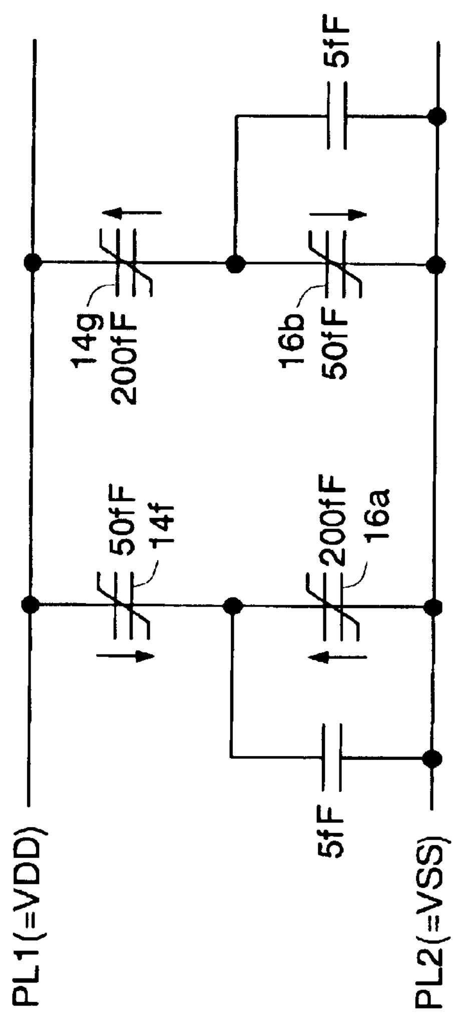
FIG. 6 is a view showing an equalizer circuit of capacitance of a nonvolatile latch circuit shown in FIG. 5.

FIG. 6 shows an equalizer circuit of capacitance of the nonvolatile latch circuit 16 shown in FIG. 5. In this example, the nonvolatile latch circuit 16 holds logic "H" in advance. At this time, the CMOS inverter 14*a* outputs a high level and the CMOS inverter 14*b* outputs a low level. Before turning-off of the power, the first plate voltage generator 10 changes the first plate voltage PL1 to a low level, high level and low level. The second plate voltage generator 18 changes the second plate voltage PL2 to a low level, high level and low level. Thereby, a low level of the node N and a high level of the node NX are respectively written in as residual dielectric polarization of the ferroelectric capacitors 14*f*, 14*g*, 16*a* and 16*b*.

In this example, average capacitances of the ferroelectric capacitors 14*f*, 14*g*, 16*a* and 16*b*, which correspond to these polarized states, are made to be 50 fF, 200 fF, 200 fF and 50 fF, respectively. Parasitic capacitances of both of the nodes N and NX when the second plate voltage PL2 is grounded are made to be 5 fF, similarly to the first embodiment.

Figure 7:
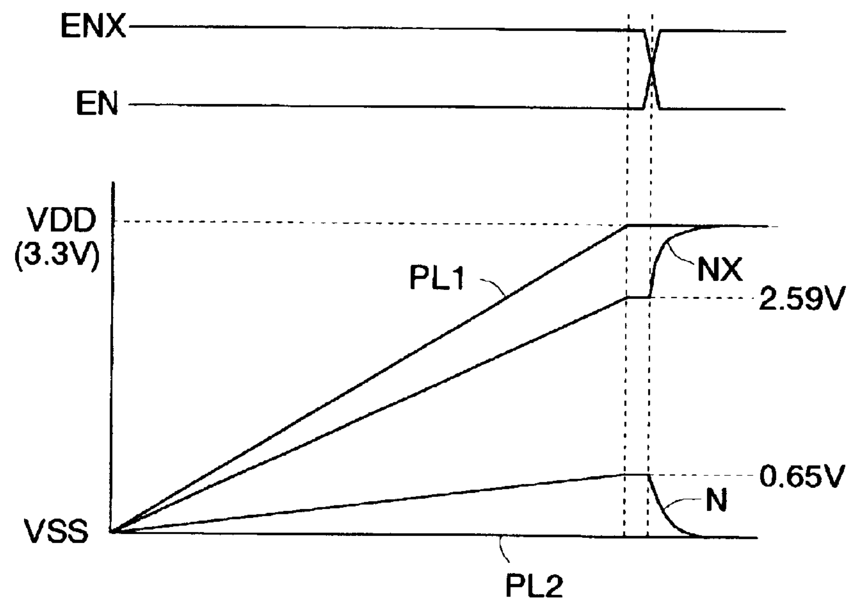
FIG. 7 is a waveform chart showing the operation of the semiconductor integrated circuit according to the second embodiment.

FIG. 7 shows the operation of the semiconductor integrated circuit according to the second embodiment. When the power is on, the clock signals CK and CKX are fixed to a high level and to a low level, respectively. Namely, the CMOS inverters 14*a* and 14*b* of the latch circuit 14*c* form a feedback loop.

The first plate voltage generator 10 follows the power supply voltage VDD to generate a first plate voltage PL1. The first plate voltage PL1 rises to a predetermined power supply voltage VDD (for example, 3.3 V). The second plate voltage generator 18 outputs the ground voltage VSS as the second plate voltage PL2. Namely, the second plate voltage generator 18 outputs the ground voltage VSS as the second plate voltage PL2 during a period from when the power is turned on until, at least, when the first plate voltage PL1 reaches the power supply voltage VDD.

While the first plate voltage PL1 is rising, the switch control circuit 12 outputs a switch control signal ENX at a high level and a switch control signal EN at a low level. The switch circuits 14*d* and 14*e* are turned off and the CMOS inverters 14*a* and 14*b* are inactivated by the switch control signal ENX at the high level and the switch control signal EN at the low level. Therefore, the nodes N and NX are floated.

The power supply voltage VDD and the ground voltage VSS are directly supplied to the substrates of the pMOS transistors and the nMOS transistors of the CMOS inverters 14*a* and 14*b*, respectively. For this reason, it is possible to avoid occurrence of latchup while the switch circuits 14*d* and 14*e* are off.

The voltage of the node N rises according to capacitance division of the ferroelectric capacitors 14*f* and 16*a* (a pair of first ferroelectric capacitors), as the first plate voltage PL1 rises. The voltage of the node NX rises according to capacitance division of the ferroelectric capacitors 14*g* and 16*b* (a pair of second ferroelectric capacitors), as the first plate voltage PL1 rises. When the first plate voltage PL1 rises to the power supply voltage VDD (3.3 V), the voltage of the node N becomes 0.65 V (3.3 V×50 fF/(5 fF+50 fF+200 fF)), and the voltage of the node NX becomes 2.59 V (3.3 V×200 fF/(5 fF+50 fF+200 fF)). Namely, the ferroelectric capacitors 14*f* and 16*a* and the ferroelectric capacitors 14*g* and 16*b* are respectively connected in series, and their intermediate nodes are respectively connected to the nodes N and NX, whereby a voltage difference between the nodes N and NX (offset voltage) increases substantially to 1.84 V.

Thereafter, similarly to the first embodiment, the switch control signals EN and ENX are changed to the high level and the low level, respectively, and the CMOS inverters 14*a* and 14*b* are activated. The latch circuit 14*c* amplifies the voltage difference of 1.84 V, and the voltage of the node N becomes the ground voltage VSS and the voltage of the node NX becomes the power supply voltage VDD. As a result of this, data corresponding to the residual dielectric polarization of the ferroelectric capacitors 14*f*, 14*g*, 16*a* and 16*b* is read into the latch circuit 14*c*. Namely, the data which is held in the latch circuit 14*c* before turning-off of the power is reproduced by recall operation.

Figure 8:
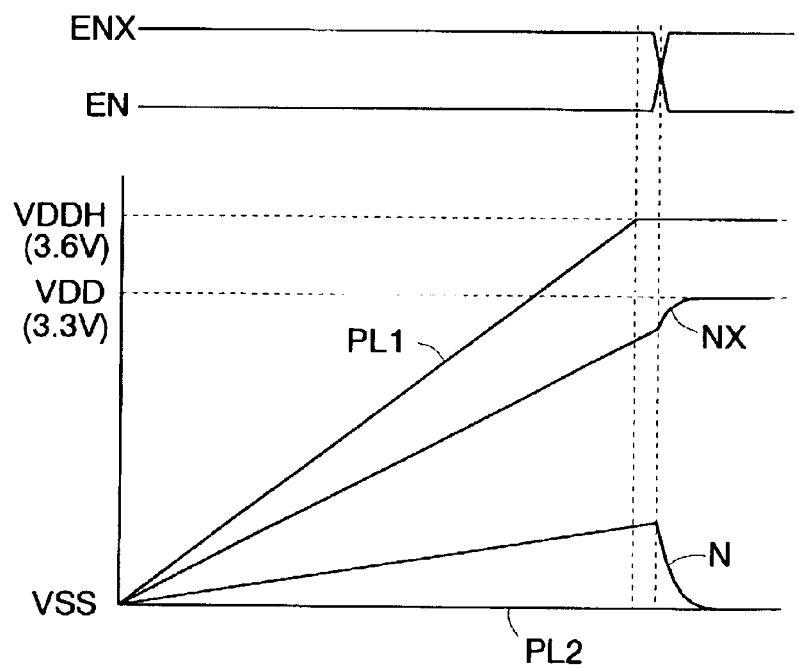
FIG. 8 is another waveform chart showing the operation of the semiconductor integrated circuit according to the second embodiment.

FIG. 8 shows another operation of the above-described semiconductor integrated circuit. In this example, the first plate voltage generator 10 generates a first plate voltage PL1 (VDDH=3.6 V) which is higher than the power supply voltage VDD (3.3 V). For this reason, it is possible to increase the offset voltage of the input nodes N and NX before the CMOS inverters 14$a$ and 14$b$ are activated, as compared with that shown in FIG. 7, and to perform the recall operation more securely.

It should be noted that, when a plurality of the nonvolatile latch circuits 16 are formed in the semiconductor integrated circuit, a chip size of the semiconductor integrated circuit can be reduced by forming the switch circuits 14$d$ and 14$e$ which are common to these nonvolatile latch circuits 16.

The same effects as those of the above-described first embodiment can be obtained in this embodiment as well. Additionally, according to this embodiment, the ferroelectric capacitors 14$f$ and 16$a$ (a pair of the first ferroelectric capacitors) and the ferroelectric capacitors 14$g$ and 16$b$ (a pair of the second ferroelectric capacitors) are respectively connected in series and their intermediate nodes are respectively connected to the inputs of the CMOS inverters 14$a$ and 14$b$. Therefore, it is possible to increase the offset voltage of the nodes N and NX by the capacitance division, and to reproduce the data which is held in the latch circuit 14$c$ before turning-off of the power more securely.

Figure 9:
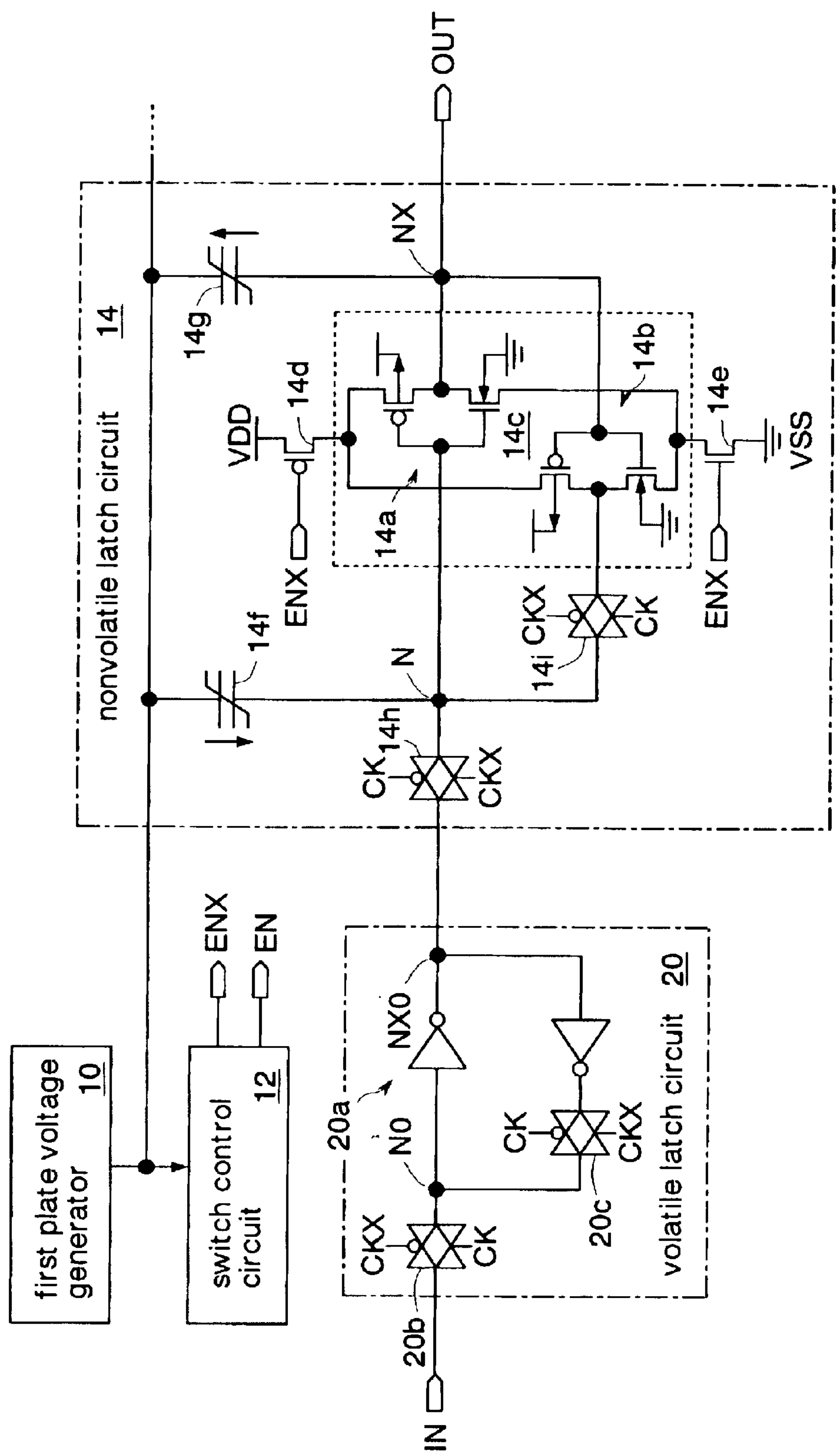
FIG. 9 is a block diagram showing a semiconductor integrated circuit according to a third embodiment of the present invention.

FIG. 9 shows a third embodiment of the present invention. The same numerals and symbols are given to designate the same circuits and signals as those explained in the first embodiment, and detailed explanations thereof will be omitted.

According to this embodiment, a semiconductor integrated circuit includes a first plate voltage generator 10, a switch control circuit 12, and a D flip-flop circuit in which a volatile latch circuit 20 and a nonvolatile latch circuit 14 are connected in cascade. The volatile latch circuit 20 includes a latch circuit 20$a$, a CMOS switch 20$b$ and a CMOS switch 20$c$.

The latch circuit 20$a$ is formed by connecting inputs and outputs of two CMOS inverters to each other. The CMOS switch 20$b$ transfers an input signal IN to the latch circuit 20$a$. The CMOS switch 20$c$ connects a feedback loop of the latch circuit 20$b$. The volatile latch circuit 20 operates as a master latch circuit, and the nonvolatile latch circuit 14 operates as a slave latch circuit. Namely, data in the slave latch circuit before the power turns off becomes valid after the power turns on.

The same effects as those of the above-described first embodiment can be obtained in this embodiment as well.

Figure 10:
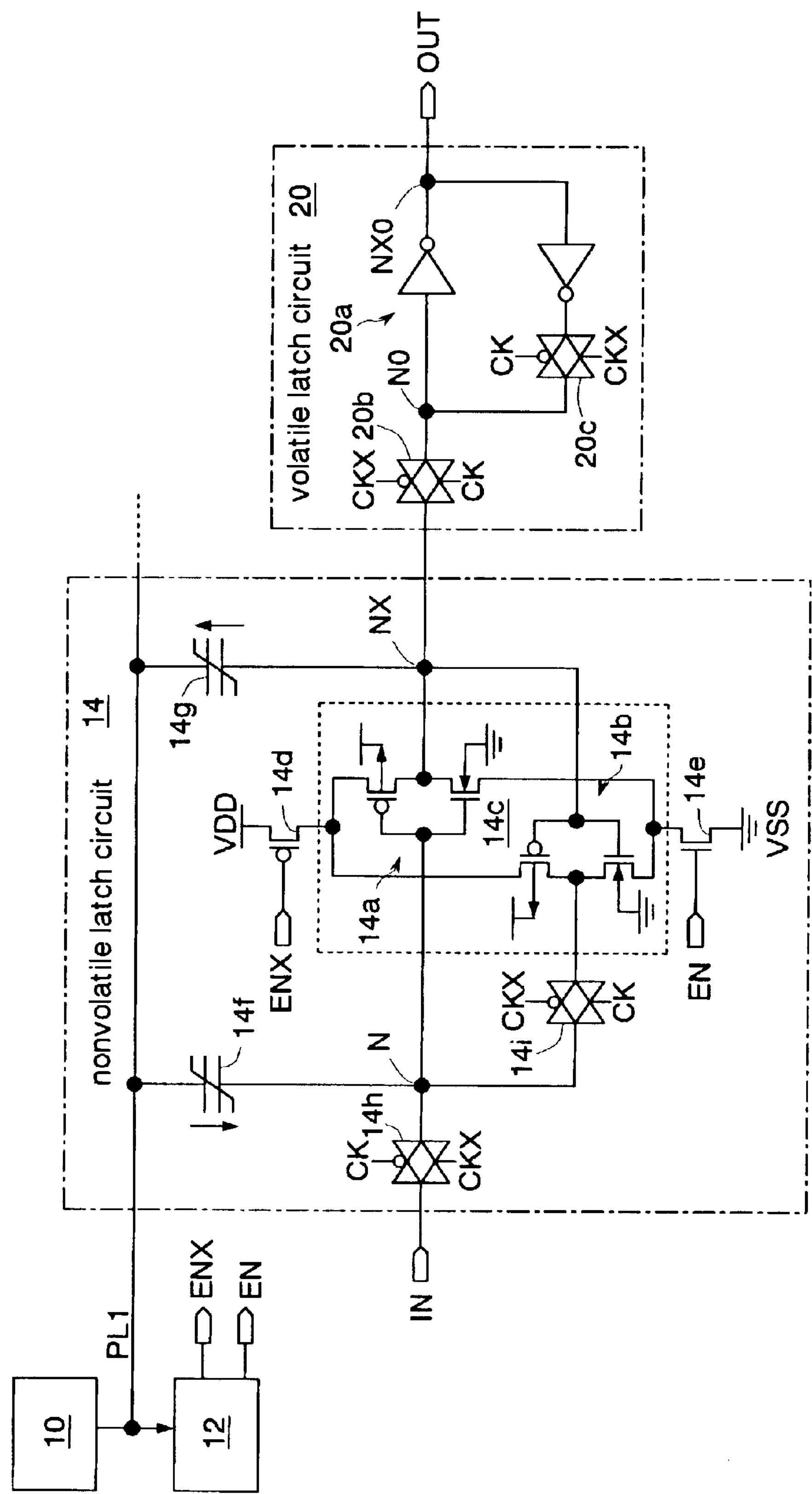
FIG. 10 is a block diagram showing a semiconductor integrated circuit according to a fourth embodiment of the present invention.

FIG. 10 shows a fourth embodiment of the present invention. The same numerals and symbols are given to designate the same circuits and signals as those explained in the first and the third embodiments, and detailed explanations thereof will be omitted.

According to this embodiment, a semiconductor integrated circuit includes a first plate voltage generator 10, a switch control circuit 12, and a D flip-flop circuit in which a nonvolatile latch circuit 14 and a volatile latch circuit 20 are connected in cascade. The nonvolatile latch circuit 14 operates as a master latch circuit, and the volatile latch circuit 20 operates as a slave latch circuit. Namely, data in the master latch circuit before the power turns off becomes valid after the power turns on. The same effects as those of the above-described first embodiment can be obtained in this embodiment as well.

Figure 11:
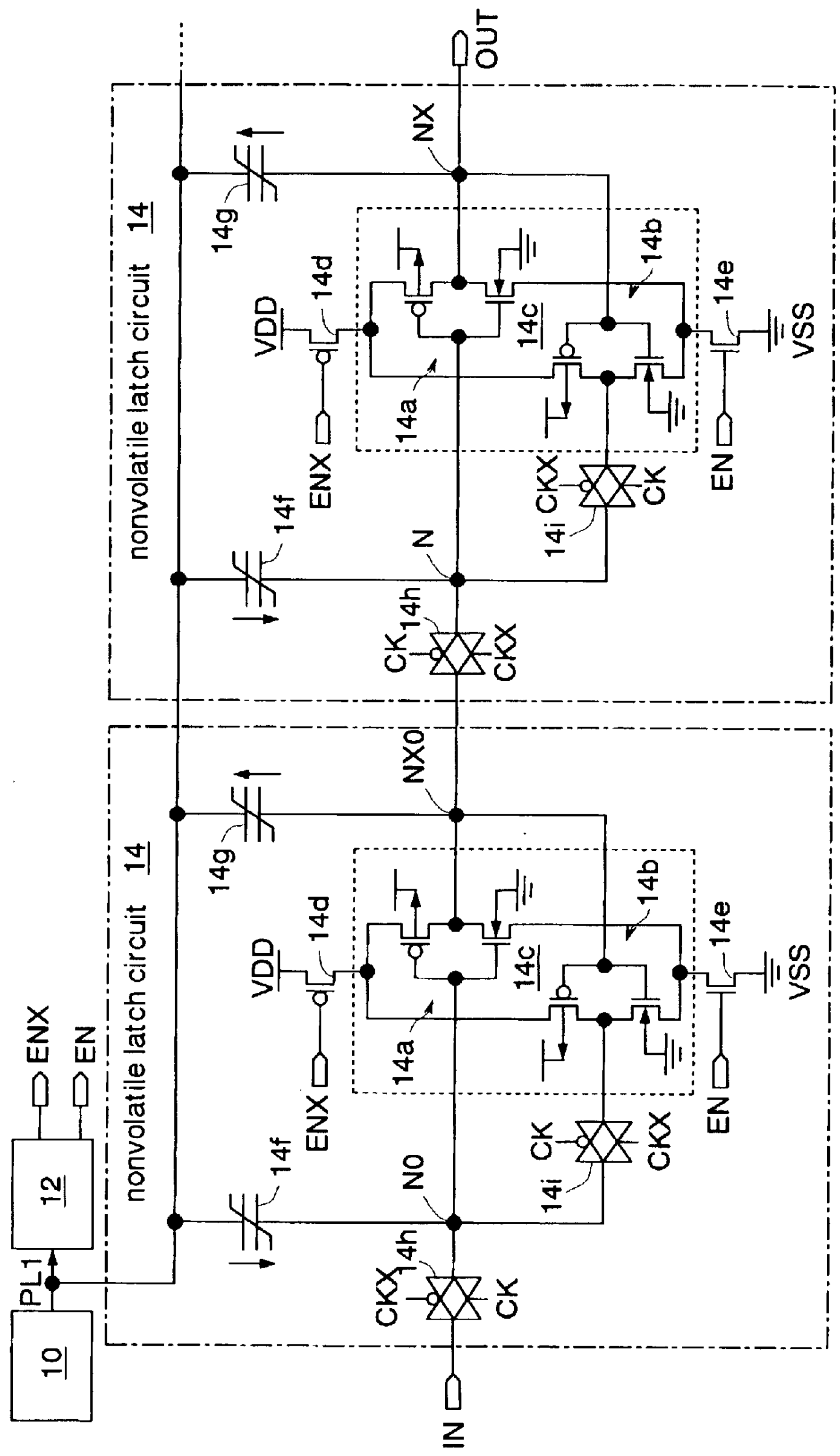
FIG. 11 is a block diagram showing a semiconductor integrated circuit according to a fifth embodiment of the present invention.

FIG. 11 shows a fifth embodiment of the present invention. The same numerals and symbols are given to designate the same circuits and signals as those explained in the first and the third embodiments, and detailed explanations thereof will be omitted.

According to this embodiment, a semiconductor integrated circuit includes a first plate voltage generator 10, a switch control circuit 12, and a D flip-flop circuit in which two nonvolatile latch circuits 14 are connected in cascade. Namely, both of data in a master latch circuit and in a slave latch circuit before the power turns off become valid after the power turns on. The same effects as those of the above-described first embodiment can be obtained in this embodiment as well.

Figure 12:
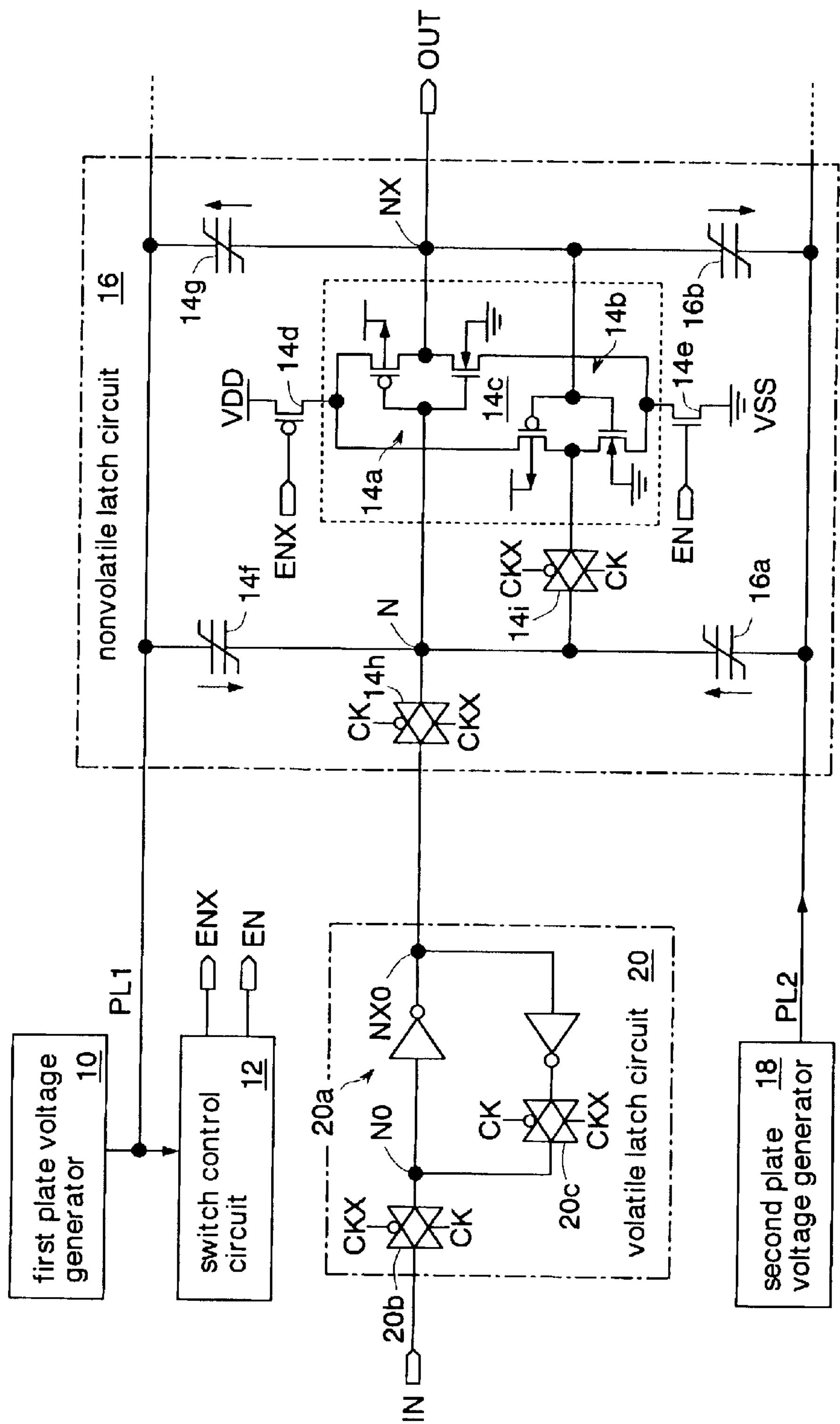
FIG. 12 is a block diagram showing a semiconductor integrated circuit according to a sixth embodiment of the present invention.

FIG. 12 shows a sixth embodiment of the present invention. The same numerals and symbols are given to designate the same circuits and signals as those explained in the second and the third embodiments, and detailed explanations thereof will be omitted.

According to this embodiment, a semiconductor integrated circuit includes a first plate voltage generator 10, a switch control circuit 12, a second plate voltage generator 18, and a D flip-flop circuit in which a volatile latch circuit 20 and a nonvolatile latch circuit 16 are connected in cascade. The volatile latch circuit 20 operates as a master latch circuit, and the nonvolatile latch circuit 16 operates as a slave latch circuit. Namely, data in the slave latch circuit before the turning-off of the power off becomes valid after the turning-on of the power.

The second plate voltage generator 18 outputs a ground voltage VSS as a second plate voltage PL2 during a period from when the power is turned on until, at least, when a first plate voltage PL1 reaches a power supply voltage VDD.

The same effects as those of the above-described first embodiment can be obtained in this embodiment as well.

Figure 13:
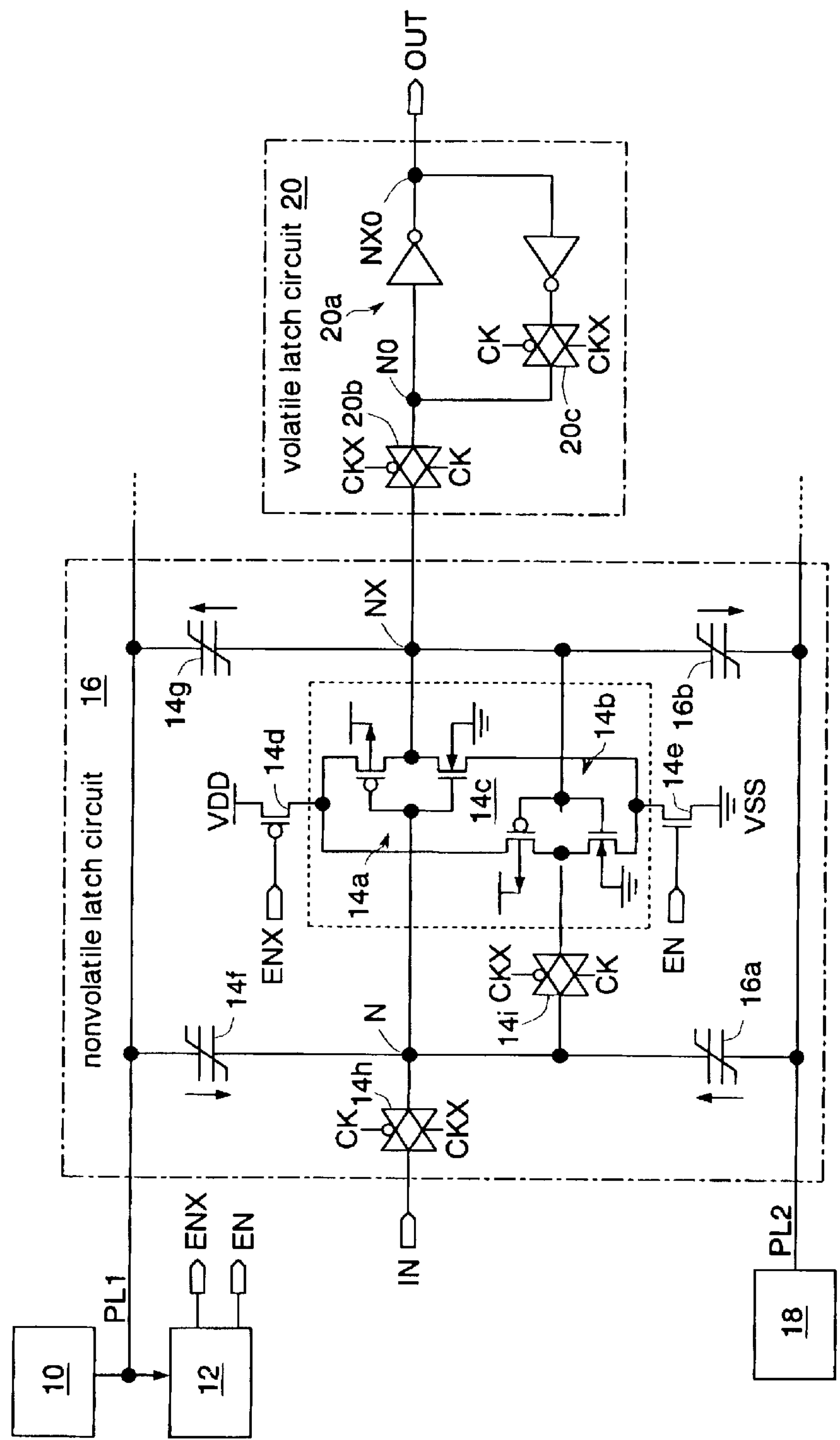
FIG. 13 is a block diagram showing a semiconductor integrated circuit according to a seventh embodiment of the present invention.

FIG. 13 shows a seventh embodiment of the present invention. The same numerals and symbols are given to designate the same circuits and signals as those explained in the second and the sixth embodiments, and detailed explanations thereof will be omitted.

According to this embodiment, a semiconductor integrated circuit includes a first plate voltage generator 10, a switch control circuit 12, a second plate voltage generator 18, and a D flip-flop circuit in which a nonvolatile latch circuit 16 and a volatile latch circuit 20 are connected in cascade. The nonvolatile latch circuit 16 operates as a master latch circuit, and the volatile latch circuit 20 operates as a slave latch circuit. Namely, data in the master latch circuit before the turning-off of the power becomes valid after the turning-on of the power. The same effects as those of the above-described first and the second embodiments can be obtained in this embodiment as well.

Figure 14:
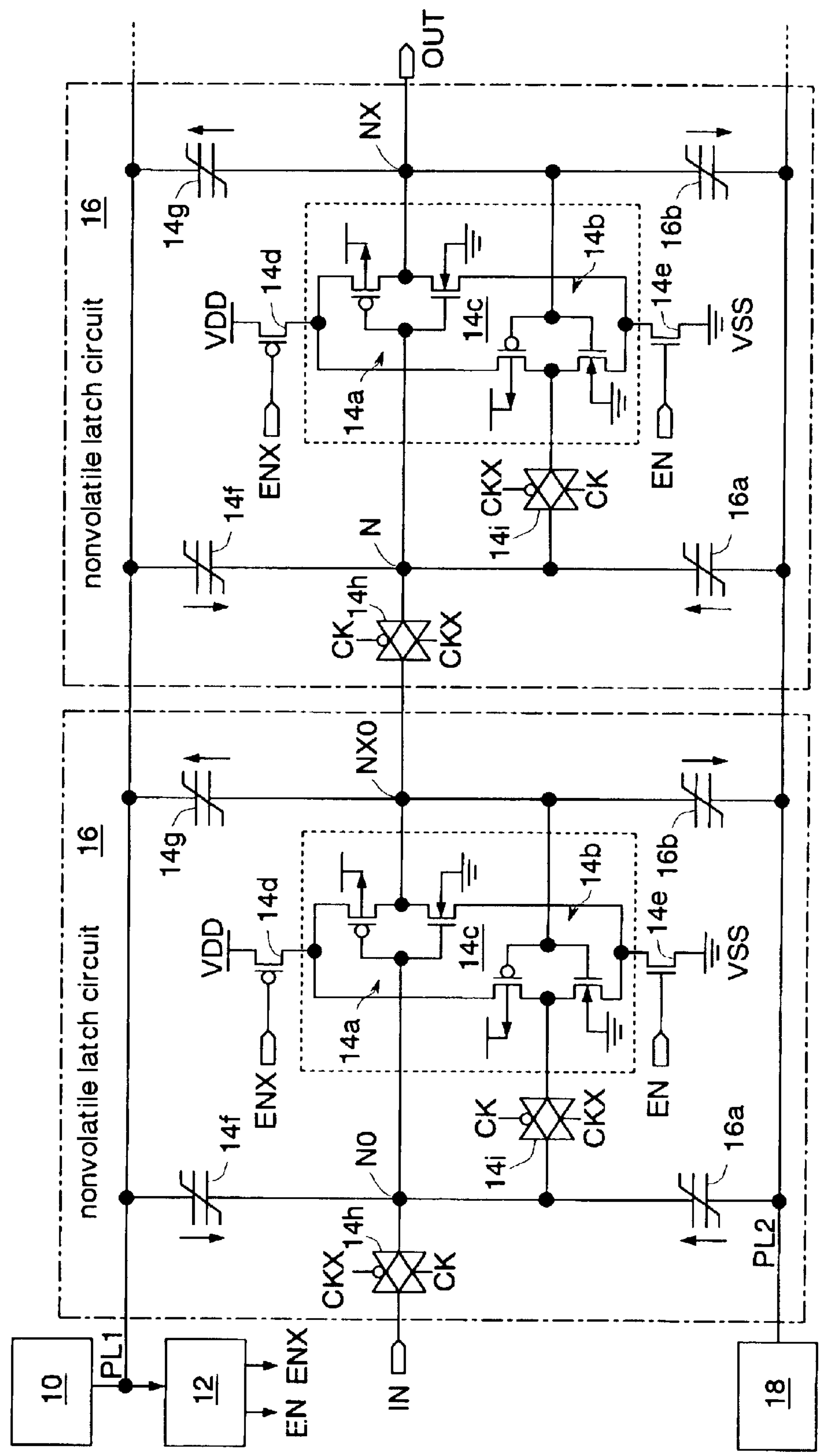
FIG. 14 is a block diagram showing a semiconductor integrated circuit according to an eighth embodiment of the present invention.

FIG. 14 shows an eighth embodiment of the present invention. The same numerals and symbols are given to designate the same circuits and signals as those explained in the second and the sixth embodiments, and detailed explanations thereof will be omitted.

According to this embodiment, a semiconductor integrated circuit includes a first plate voltage generator 10, a switch control circuit 12, a second plate voltage generator 18, and a D flip-flop circuit in which two nonvolatile latch circuits 16 are connected in cascade. Namely, both of data in the master latch circuit and data in the slave latch circuit before the turning-off of the power become valid after the turning-on of the power. The same effects as those of the above-described first and the second embodiments can be obtained in this embodiment as well.

Figure 15:
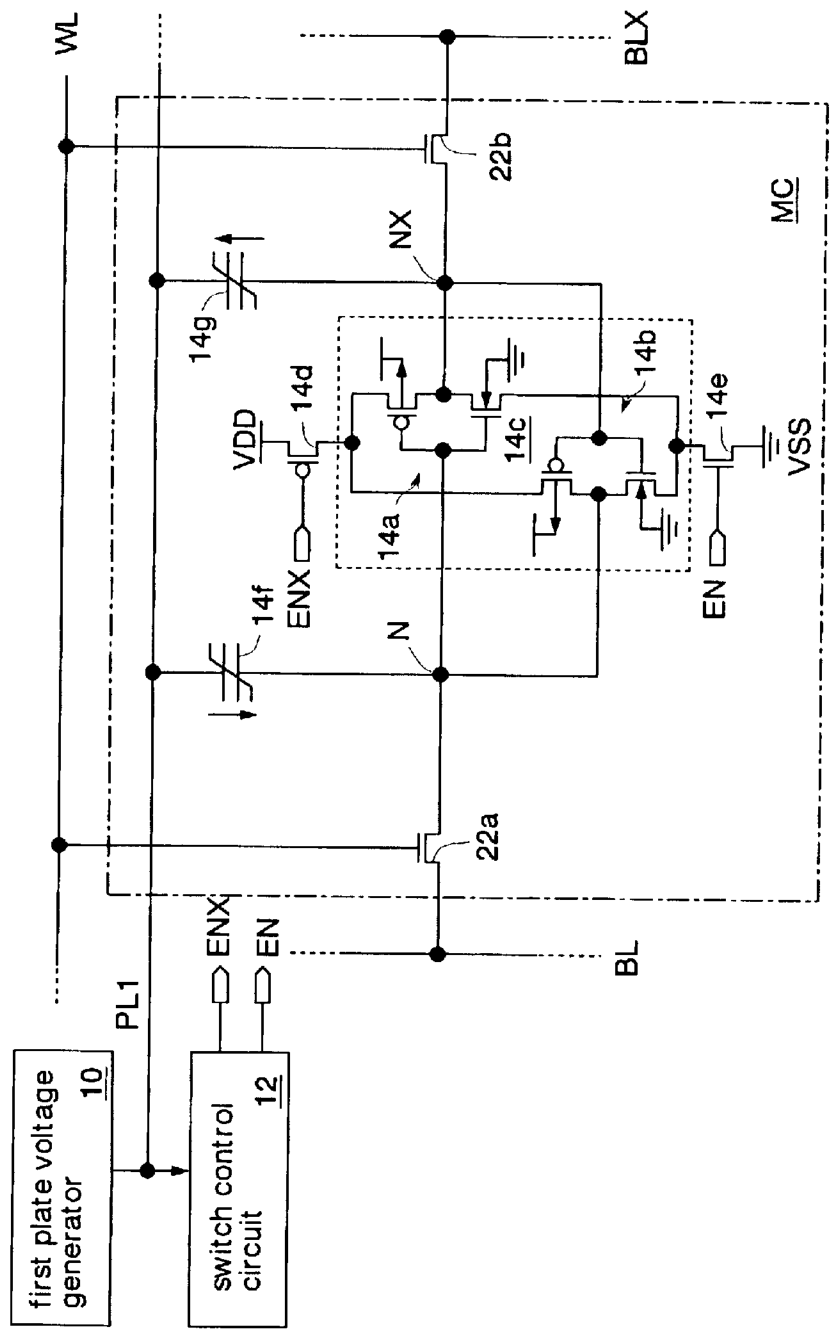
FIG. 15 is a block diagram showing a semiconductor memory according to a ninth embodiment of the present invention.

FIG. 15 shows a ninth embodiment of the present invention. The same numerals and symbols are given to designate the same circuits and signals as those explained in the first embodiment, and detailed explanations thereof will be omitted.

According to this embodiment, the present invention is applied to a nonvolatile SRAM. The nonvolatile SRAM includes a first plate voltage generator 10, a switch control circuit 12, and a memory cell array including a plurality of memory cells MC. Although not particularly shown in the drawing, the nonvolatile SRAM includes circuits such as input circuits of an address signal and a control signal, a data input/output circuit, a command decoder for decoding the control signal, a timing generator, a word decoder, a column decoder, a sense amplifier and the like.

The memory cell MC includes a latch circuit 14*c* which includes two CMOS inverters (inversion circuits) 14*a* and 14*b* whose inputs and outputs are connected to each other, a switch circuit 14*d* which is made up of a PMOS transistor, a switch circuit 14*e* which is made up of an nMOS transistor, ferroelectric capacitors 14*f* and 14*g*, and transfer switches 22*a* and 22*b*. Substrates of pMOS transistors and nMOS transistors which make the CMOS inverters 14*a* and 14*b* are connected to a power source line VDD and a ground line VSS, respectively.

The switch circuit 14*d* connects sources (power supply terminals) of the pMOS transistors of the CMOS inverters 14*a* and 14*b* to the power source line VDD. The switch circuit 14*e* connects sources (power supply terminals) of the nMOS transistors of the CMOS inverters 14*a* and 14*b* to the ground line VSS. One end of the ferroelectric capacitor 14*f* is connected to an input node N of the CMOS inverter 14*a*, and the other end is connected to a plate line PL1. One end of the ferroelectric capacitor 14*g* is connected to an input node NX of the CMOS inverter 14*b*, and the other end is connected to the plate line PL1.

The transfer switch 22*a* connects the node N to a bit line BL. The transfer switch 22*b* connects a node NX to a bit line BLX. The transfer switches 22*a* and 22*b* turn on when a word line WL is at a high level.

In the above-described nonvolatile SRAM, during write operation, write data are supplied to the bit lines BL and BLX, which are complementary to each other, and the word line WL is turned into the high level. The write data which are complementary to each other are written into the latch circuit 14*c* through the transfer switches 22*a* and 22*b*. The data written into the latch circuit 14*c* are held therein while the power supply voltage VDD is supplied to the nonvolatile SRAM.

Before turning-off of the power, the first plate voltage PL1 changes to a low level, high level and low level, whereby, for example, a high level of the node N (logic "H") and a low level of the node NX (logic "L") are respectively written in as residual dielectric polarization of the ferroelectric capacitors 14*f* and 14*g*. Then, the power is turned off.

When the power is turned on again, the word line WL is fixed to a low level for a predetermined period from the turning-on of the power. Namely, the CMOS inverters 14*a* and 14*b* of the latch circuit 14*c* form a feedback loop. Thereafter, similarly to the first embodiment, the first plate voltage generator 10 follows the power supply voltage VDD to generate the first plate voltage PL1. Due to a capacitance coupling effect of the ferroelectric capacitors 14*f* and 14*g*, voltages of the nodes N and NX rise as the first plate voltage PL1 rises.

After the first plate voltage PL1 rose to the power supply voltage VDD, the switch control circuit 12 changes the switch control signals EN and ENX to a high level and to a low level, respectively. Because of these changes, the CMOS inverters 14*a* and 14*b* are activated. The latch circuit 14*c* amplifies a voltage difference between the nodes N and NX, and reproduces data held in the memory cell MC before turning-off of the power.

The same effects as those of the first embodiment can be obtained in this embodiment as well.

Figure 16:
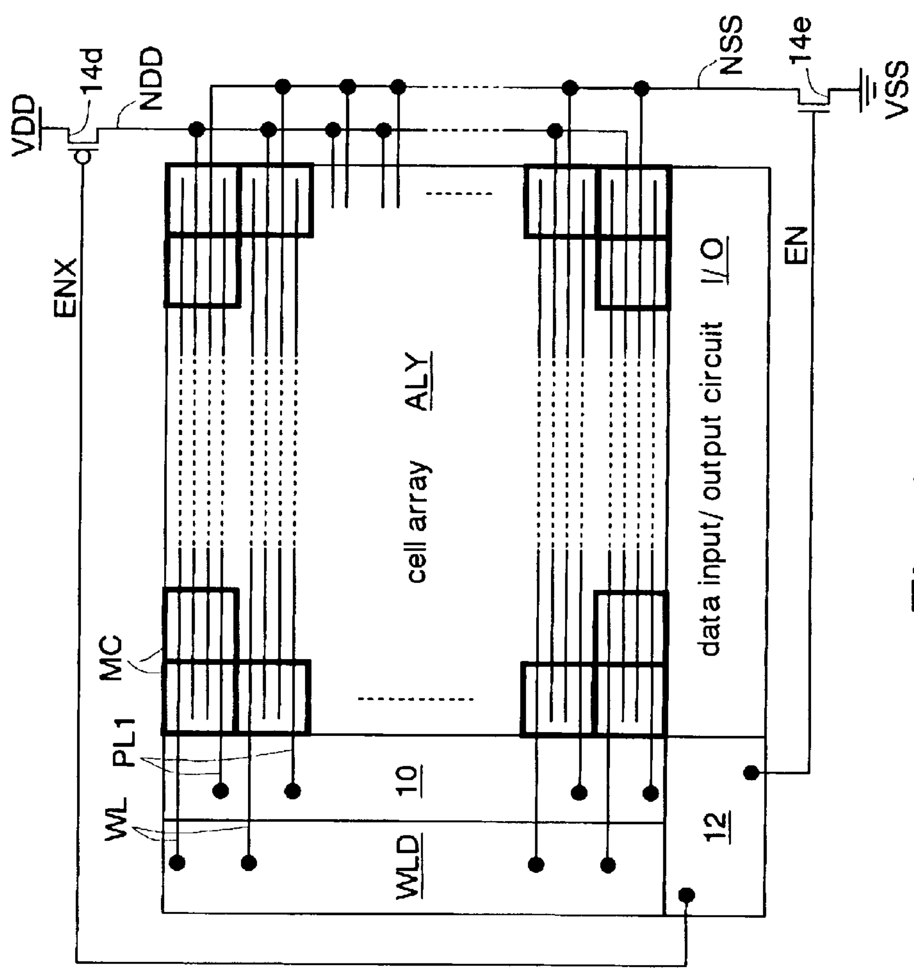
FIG. 16 is a block diagram showing a semiconductor memory according to a tenth embodiment of the present invention.

FIG. 16 shows a tenth embodiment of the present invention. The same numerals and symbols are given to designate the same circuits and signals as those explained in the first and the ninth embodiments, and detailed explanations thereof will be omitted.

According to this embodiment, the present invention is applied to a nonvolatile SRAM. The nonvolatile SRAM includes a word decoder WLD, a first plate voltage generator 10, a switch control circuit 12, switch circuits 14*d* and 14*e*, a memory cell array ALY including a plurality of memory cells MC, and a data input/output circuit I/O.

The present invention is characterized in that the switch circuits 14*d* and 14*e* are shared by a plurality of the memory cells MC. Drains of the switch circuits 14*d* and 14*e* are respectively connected to power supply lines NDD and NSS. Word lines WL, supply lines of a first plate voltage PL1, and the power supply lines NDD and NSS are wired to the memory cells MC in a horizontal direction of the drawing. Although not shown in the drawing, the nonvolatile SRAM includes circuits such as input circuits of an address signal and a control signal, a command decoder for decoding the control signal, a timing generator, a column decoder, a sense amplifier and the like.

Figure 17:
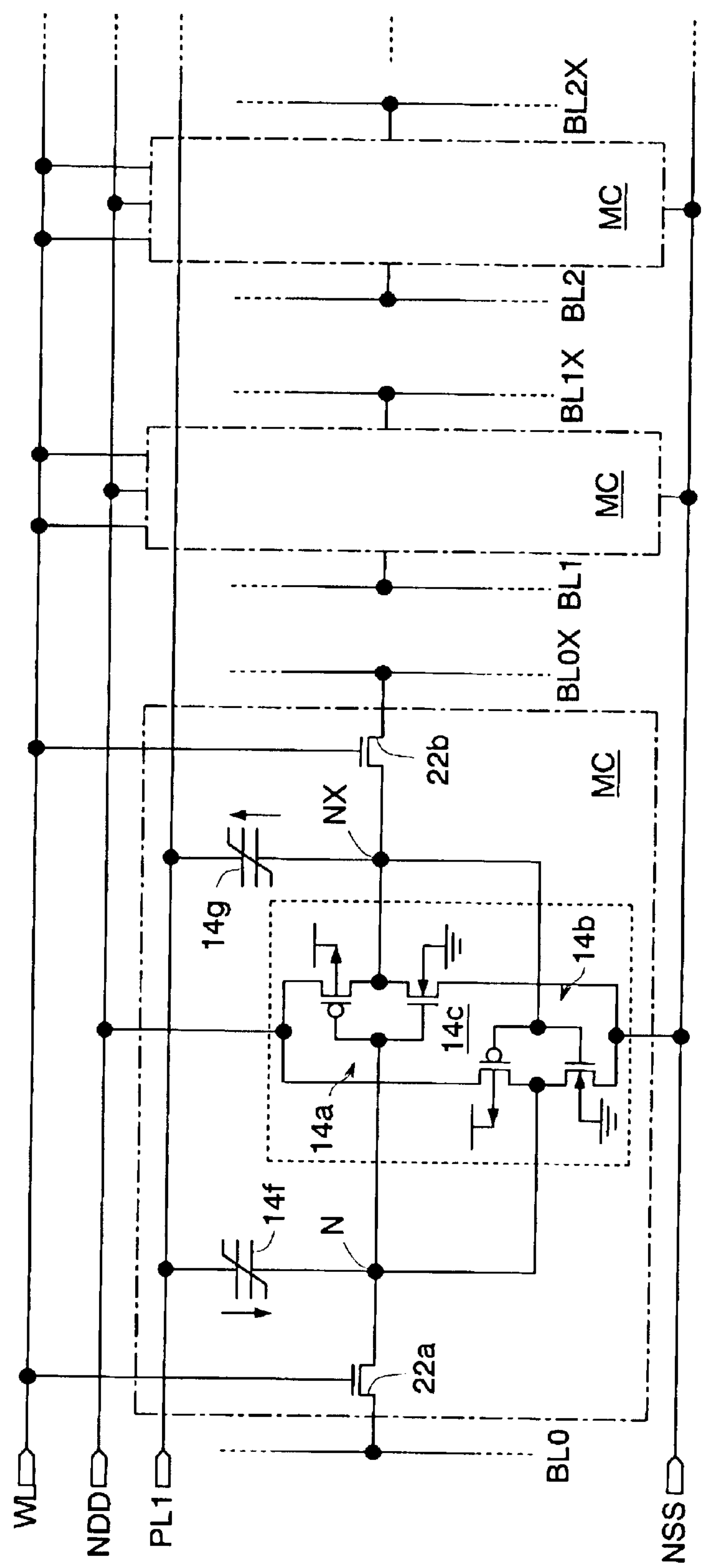
FIG. 17 is a circuit diagram showing a memory cell in FIG. 16 in detail.

FIG. 17 shows the details of the memory cell MC. The memory cell MC includes a latch circuit 14*c* which includes two CMOS inverters (inversion circuits) 14*a* and 14*b* whose inputs and outputs are connected to each other, ferroelectric capacitors 14*f* and 14*g*, and transfer switches 22*a* and 22*b*. The memory cell MC of this embodiment does not include switch circuits 14*d* and 14*e*. Hence, a layout size of the memory cell MC is reduced, and a layout size of the memory cell array ALY is reduced. As a result of this, it is possible to reduce a chip size of the nonvolatile SRAM.

Since the operation of this nonvolatile SRAM is the same as that of the above-described ninth embodiment, its explanation is omitted.

The same effects as those of the above-described first embodiment can be obtained in this embodiment as well. Further, according to this embodiment, the switch circuits 14*d* and 14*e* are shared by a plurality of the memory cells MC. Therefore, it is possible to reduce the layout size of the memory cell MC and to reduce the chip size of the nonvolatile SRAM.

Figure 18:
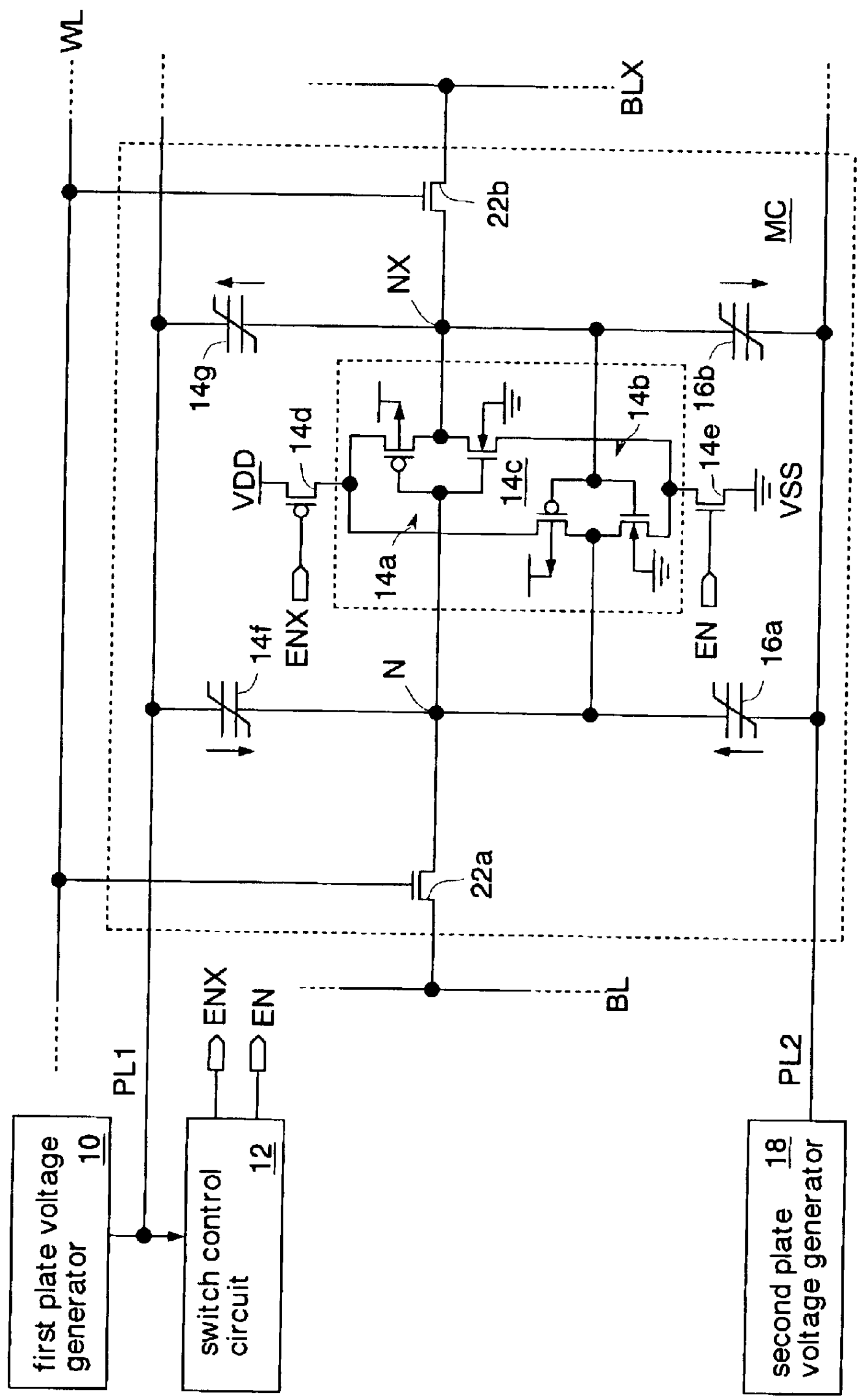
FIG. 18 is a block diagram showing a semiconductor memory according to an eleventh embodiment of the present invention.

FIG. 18 shows an eleventh embodiment of the present invention. The same numerals and symbols are given to designate the same circuits and signals as those explained in the second and the ninth embodiments, and detailed explanations thereof will be omitted.

According to this embodiment, the present invention is applied to a nonvolatile SRAM. The nonvolatile SRAM includes a first plate voltage generator 10, a switch control circuit 12, a second plate voltage generator 18, and a memory cell array including a plurality of memory cells MC. Although not particularly shown in the drawing, the nonvolatile SRAM includes circuits such as input circuits of an address signal and a control signal, a data input/output circuit, a command decoder for decoding the control signal, a timing generator, a word decoder, a column decoder, a sense amplifier and the like.

The memory cell MC is formed by adding ferroelectric capacitors 16*a* and 16*b* to the memory cell MC of the ninth embodiment (FIG. 15). One end of the ferroelectric capacitor 16*a* is connected to an input node N of the CMOS inverter 14*a*, and the other end is connected to a second plate line PL2. One end of the ferroelectric capacitor 16*b* is connected to an input node NX of the CMOS inverter 14*b*, and the other end is connected to the second plate line PL2. The rest of the structure is the same as that of the ninth embodiment.

In the above-described nonvolatile SRAM, during write operation, write data are supplied to bit lines BL and BLX, which are complementary to each other, and a word line WL is turned into a high level, similarly to the ninth embodiment. The write data which are complementary to each other are written into the latch circuit 14*c* through transfer switches 22*a* and 22*b*. The data written into the latch circuit 14*c* are held therein while a power supply voltage VDD is supplied to the nonvolatile SRAM.

Before turning-off of the power, a first plate voltage PL1 and the second plate voltage PL2 change to a low level, high level and low level, whereby a high level of the node N and a low level of the node NX are respectively written in as residual dielectric polarization of the ferroelectric capacitors 14*f*, 14*g*, 16*a* and 16*b*. Then, the power is turned off.

When the power is turned on again, the word line WL is fixed to a low level for a predetermined period from the turning-on of the power, and the CMOS inverters 14*a* and 14*b* form a feedback loop. Thereafter, similarly to the second embodiment, the first plate voltage PL1 rises while the second plate voltage PL2 is fixed to a ground voltage VSS.

Namely, the second plate voltage generator 18 outputs the ground voltage VSS as the second plate voltage PL2 during a period from when the power is turned on until, at least, when the first plate voltage PL1 reaches the power supply voltage VDD. The voltage of the node N rises according to capacitance division of the ferroelectric capacitors 14*f* and 16*a*, as the first plate voltage PL1 rises. The voltage of the node NX rises according to capacitance division of the ferroelectric capacitors 14*g* and 16*b*, as the first plate voltage PL1 rises.

After the first plate voltage PL1 rose to the power supply voltage VDD, switch control signals EN and ENX are changed to a high level and to a low level, respectively.

Because of these changes, the CMOS inverters 14*a* and 14*b* are activated, and the latch circuit 14*c* amplifies a voltage difference between the nodes N and NX, and reproduces data held in the memory cell MC before turning-off of the power.

The same effects as those of the above-described second embodiment can be obtained in this embodiment as well.

Figure 19:
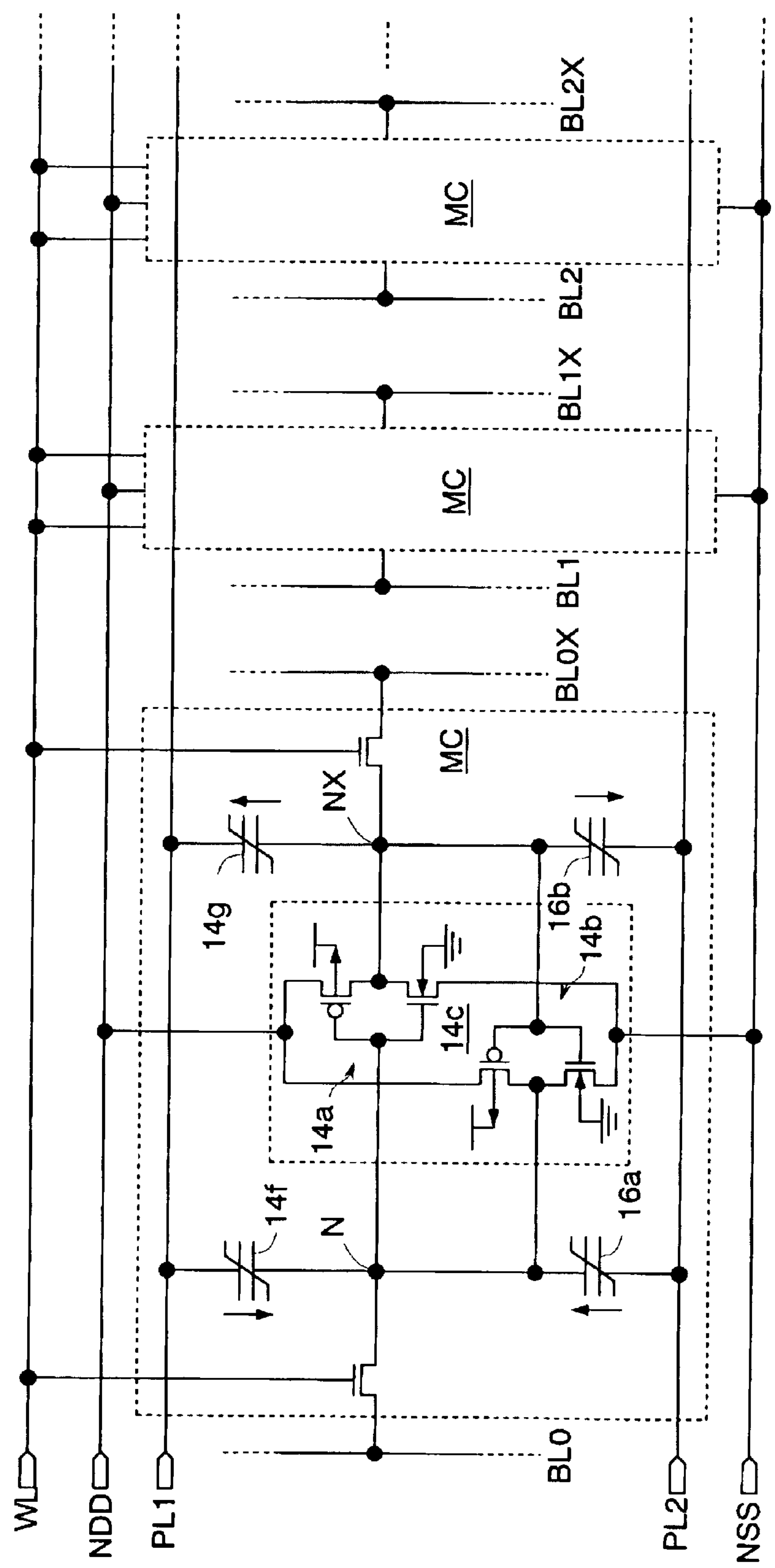
FIG. 19 is a block diagram showing a memory cell according to a twelfth embodiment of the present invention.

FIG. 19 shows a twelfth embodiment of the present invention. The same numerals and symbols are given to designate the same circuits and signals as those explained in the second and the tenth embodiments, and detailed explanations thereof will be omitted.

This embodiment is the same as the above-described tenth embodiment, except for the structure of the memory cell MC. Namely, although not particularly shown in the drawing, a nonvolatile SRAM includes a word decoder WLD, a first plate voltage generator 10, a switch control circuit 12, switch circuits 14*d* and 14*e*, a memory cell array ALY including a plurality of memory cells MC, and a data input/output circuit I/O which are shown in FIG. 16.

The memory cell MC is formed by adding ferroelectric capacitors 16*a* and 16*b* to the memory cell MC of the tenth embodiment (FIG. 17). One end of the ferroelectric capacitor 16*a* is connected to an input node N of a CMOS inverter 14*a*, and the other end is connected to a second plate line PL2. One end of the ferroelectric capacitor 16*b* is connected to an input node NX of a CMOS inverter 14*b*, and the other end is connected to the second plate line PL2.

Since the operation of the nonvolatile SRAM of this embodiment is the same as that of the above-described eleventh embodiment, its explanation is omitted. The same effects as those of the above-described second and tenth embodiments can be obtained in this embodiment as well.

Incidentally, in the above-described embodiments, the example of connecting the substrates of the pMOS transistors and nMOS transistors which make the CMOS inverters 14*a* and 14*b* to the power source line VDD and the ground line VSS, respectively, is explained. The present invention is not limited to the above embodiments. When, for example, a diffusion layer of the semiconductor substrate is structured so as not to generate the latchup, the substrates of the pMOS transistors and nMOS transistors which make the CMOS inverters 14*a* and 14*b* may be connected to the sources of the pMOS transistors and to the sources of the nMOS transistors, respectively.

In the above-described ninth to twelfth embodiments, the example of applying the present invention to the memory cell MC having the two CMOS inverters (inversion circuits) 14*a* and 14*b* (the so-called six-transistor type) is explained. The present invention is not limited to the above embodiments. For example, the present invention may be applied to a memory cell having a pair of inversion circuits which are an nMOS transistor and a high resistor (the so-called four-transistor type).

The invention is not limited to the above embodiments and various modifications may be made without departing from the spirit and scope of the invention. Any improvement may be made in part or all of the components.

What is claimed is:

1. A semiconductor integrated circuit comprising:

a latch circuit having two buffer circuits whose inputs and outputs are connected to each other;

a pair of ferroelectric capacitors whose one ends are respectively connected to the inputs of said buffer circuits and the other ends are connected to a first plate line;

switch circuit(s) for connecting power supply terminals of said buffer circuits to power source line(s) according to switch control signal(s);

a first plate voltage generator for generating a first plate voltage to be supplied to said first plate line; and a switch control circuit for activating said switch control signal(s) and turning on said switch circuit(s), when said first plate voltage rises to a predetermined voltage after the power turns on.

2. The semiconductor integrated circuit according to claim 1, wherein:

each of said buffer circuits is structured of a CMOS inverter made up of a pMOS transistor and an nMOS transistor;

a source of said pMOS transistor is connected to one of said power source lines through one of said switch circuits;

a source of said nMOS transistor is connected to a ground line, which is the other of said power source lines, through the other of said switch circuits;

a substrate of said PMOS transistor is connected to said power source line; and a substrate of said nMOS transistor is connected to said ground line.

3. A semiconductor integrated circuit comprising:

a latch circuit having two buffer circuits whose inputs and outputs are connected to each other;

a pair of first ferroelectric capacitors being connected in series between a first plate line and a second plate line, wherein an intermediate node connecting the pair of first ferroelectric capacitors is connected to an input of one of said buffer circuits;

a pair of second ferroelectric capacitors being connected in series between said first plate line and said second plate line, wherein an intermediate node connecting the pair of second ferroelectric capacitors is connected to an input of the other of said buffer circuits;

switch circuit(s) for connecting power supply terminals of said buffer circuits to power source line(s) according to switch control signal(s);

a first plate voltage generator for generating a first plate voltage to be supplied to said first plate line;

a second plate voltage generator for generating a second plate voltage which is lower than said first plate voltage and is supplied to said second plate line for a predetermined period after the power turns on; and a switch control circuit for activating said switch control signal(s) and turning on said switch circuit(s), when said first plate voltage rises to a predetermined voltage after the power turns on.

4. The semiconductor integrated circuit according to claim 3, wherein said second plate voltage generator outputs a ground voltage as said second plate voltage for at least said predetermined period.

5. The semiconductor integrated circuit according to claim 4, wherein:

each of said buffer circuits is structured of a CMOS inverter made up of a pMOS transistor and an nMOS transistor;

a source of said pMOS transistor is connected to one of said power source lines through one of said switch circuits;

a source of said nMOS transistor is connected to a ground line, which is the other of said power source lines, through the other of said switch circuits;

a substrate of said pMOS transistor is connected to said power source line; and a substrate of said nMOS transistor is connected to said ground line.

6. A semiconductor integrated circuit having a storage circuit in which a master latch circuit and a slave latch circuit are cascaded, wherein at least one of said master latch circuit and said slave latch circuit comprise(s):

a latch circuit having two buffer circuits whose inputs and outputs are connected to each other;

a pair of ferroelectric capacitors whose one ends are respectively connected to the inputs of said buffer circuits and the other ends are connected to a first plate line;

switch circuit(s) for connecting power supply terminals of said buffer circuits to power source line(s) according to switch control signal(s);

a first plate voltage generator for generating a first plate voltage to be supplied to said first plate line; and a switch control circuit for activating said switch control signal(s) and turning on said switch circuits, when said first plate voltage rises to a predetermined voltage after the power turns on.

7. The semiconductor integrated circuit according to claim 6, wherein:

each of said buffer circuits is structured of a CMOS inverter made up of a pMOS transistor and an nMOS transistor;

a source of said pMOS transistor is connected to one of said power source lines through one of said switch circuits;

a source of said nMOS transistor is connected to a ground line, which is the other of said power source lines, through the other of said switch circuits;

a substrate of said pMOS transistor is connected to said power source line; and a substrate of said nMOS transistor is connected to said ground line.

8. A semiconductor integrated circuit having a storage circuit in which a master latch circuit and a slave latch circuit are cascaded, wherein at least one of said master latch circuit and said slave latch circuit comprise(s):

a latch circuit having two buffer circuits whose inputs and outputs are connected to each other;

a pair of first ferroelectric capacitors being connected in series between a first plate line and a second plate line, wherein an intermediate node connecting the pair of first ferroelectric capacitors is connected to an input of one of said buffer circuits;

a pair of second ferroelectric capacitors being connected in series between said first plate line and said second plate line, wherein an intermediate node connecting the pair of second ferroelectric capacitors is connected to an input of the other of said buffer circuits;

switch circuit(s) for connecting power supply terminals of said buffer circuits to power source line(s) according to switch control signal(s);

a first plate voltage generator for generating a first plate voltage to be supplied to said first plate line;

a second plate voltage generator for generating a second plate voltage which is lower than said first plate voltage and is supplied to said second plate line for a predetermined period after the power turns on; and a switch control circuit for activating said switch control signal(s) and turning on said switch circuit(s), when said first plate voltage rises to a predetermined voltage after the power turns on.

9. The semiconductor integrated circuit according to claim 8, wherein said second plate voltage generator outputs a ground voltage as said second plate voltage for at least said predetermined period.

10. The semiconductor integrated circuit according to claim 8, wherein:

each of said buffer circuits is structured of a CMOS inverter made up of a pMOS transistor and an nMOS transistor;

a source of said pMOS transistor is connected to one of said power source lines through one of said switch circuits;

a source of said nMOS transistor is connected to a ground line, which is the other of said power source lines, through the other of said switch circuits;

a substrate of said pMOS transistor is connected to said power source line; and a substrate of said nMOS transistor is connected to said ground line.

11. A semiconductor memory comprising:

a plurality of memory cells, each of which has a latch circuit having two inversion circuits whose inputs and outputs are connected to each other and a pair of ferroelectric capacitors whose one ends are respectively connected to the inputs of said inversion circuits and the other ends are connected to a first plate line;

switch circuit(s) for connecting power supply terminals of said inversion circuits to power source line(s) according to switch control signal(s);

a first plate voltage generator for generating a first plate voltage to be supplied to said first plate line; and a switch control circuit for activating said switch control signal(s) and turning on said switch circuit(s), when said first plate voltage rises to a predetermined voltage after the power turns on.

12. The semiconductor memory according to claim 11, wherein:

each of said inversion circuits is structured of a CMOS inverter made up of a pMOS transistor and an nMOS transistor;

a source of said pMOS transistor is connected to one of said power source lines through one of said switch circuits;

a source of said nMOS transistor is connected to a ground line, which is the other of said power source lines, through the other of said switch circuits;

a substrate of said pMOS transistor is connected to said power source line; and a substrate of said nMOS transistor is connected to said ground line.

13. The semiconductor memory according to claim 11, wherein said switch circuit(s) is/are formed to be common to said plurality of memory cells.

14. A semiconductor memory comprising:

a plurality of memory cells, each of which has a latch circuit having two inversion circuits whose inputs and outputs are connected to each other, a pair of first ferroelectric capacitors being connected in series between a first plate line and a second plate line, wherein an intermediate node connecting the pair of first ferroelectric capacitors is connected to an input of one of said inversion circuits, and a pair of second ferroelectric capacitors being connected in series between said first plate line and said second plate line, wherein an intermediate node connecting the pair of second ferroelectric capacitors is connected to an input of the other of said inversion circuits;

switch circuit(s) for connecting power supply terminals of said inversion circuits to power source line(s) according to switch control signal(s);

a first plate voltage generator for generating a first plate voltage to be supplied to said first plate line;

a second plate voltage generator for generating a second plate voltage which is lower than said first plate voltage and is supplied to said second plate line for a predetermined period after the power turns on; and a switch control circuit for activating said switch control signal(s) and turning on said switch circuit(s), when said first plate voltage rises to a predetermined voltage after the power turns on.

15. The semiconductor memory according to claim 14, wherein said second plate voltage generator outputs a ground voltage as said second plate voltage for at least said predetermined period.

16. The semiconductor memory according to claim 14, wherein each of said inversion circuits is structured of a CMOS inverter made up of a pMOS transistor and an nMOS transistor;

a source of said pMOS transistor is connected to one of said power source lines through one of said switch circuits;

a source of said nMOS transistor is connected to a ground line, which is the other of said power source lines, through the other of said switch circuits;

a substrate of said pMOS transistor is connected to said power source line; and a substrate of said nMOS transistor is connected to said ground line.

17. The semiconductor memory according to claim 14, wherein said switch circuit(s) is/are formed to be common to said plurality of memory cells.

* * * * *